US009964263B2

(12) United States Patent
Li et al.

(10) Patent No.: US 9,964,263 B2
(45) Date of Patent: May 8, 2018

(54) LED TUBE LAMP

(71) Applicant: JIAXING SUPER LIGHTING ELECTRIC APPLIANCE CO., LTD., Jiaxing (CN)

(72) Inventors: Li-Qin Li, Jiaxing (CN); Xiao-Su Yang, Jiaxing (CN); Yue-Qiang Zhang, Jiaxing (CN)

(73) Assignee: Jiaxing Super Lighting Electric Appliance Co., Ltd., Jiaxing, Shejiang (CN)

( * ) Notice: Subject to any disclaimer, the term of this patent is extended or adjusted under 35 U.S.C. 154(b) by 0 days. days.

(21) Appl. No.: 15/414,263

(22) Filed: Jan. 24, 2017

(65) Prior Publication Data

US 2017/0130911 A1 May 11, 2017

Related U.S. Application Data

(63) Continuation of application No. 14/724,840, filed on May 29, 2015, now Pat. No. 9,625,137, which is a
(Continued)

(30) Foreign Application Priority Data

Sep. 28, 2014 (CN) .......................... 2014 1 0507660
Sep. 28, 2014 (CN) .......................... 2014 1 0508899
(Continued)

(51) Int. Cl.
*F21V 1/00* (2006.01)
*F21K 9/68* (2016.01)
(Continued)

(52) U.S. Cl.
CPC ................ *F21K 9/68* (2016.08); *F21K 9/275* (2016.08); *F21K 9/278* (2016.08); *F21S 4/24* (2016.01);
(Continued)

(58) Field of Classification Search
CPC .......... F21K 9/272; F21K 9/275; F21K 9/278; F21K 9/68; F21S 4/24; F21V 23/06;
(Continued)

(56) References Cited

U.S. PATENT DOCUMENTS 2,454,049 A 11/1948 Floyd, Jr.
3,294,518 A 12/1966 Laseck
(Continued)

FOREIGN PATENT DOCUMENTS

CN 200980183 11/2007
CN 200980183 Y 11/2007
(Continued)

*Primary Examiner* — Tsion Tumebo
(74) *Attorney, Agent, or Firm* — Muir Patent Law, PLLC

(57) ABSTRACT

An LED tube lamp includes a lamp tube, an LED light bar disposed inside the lamp tube with a plurality of LED light sources provided on the LED light bar, a diffusion film layer disposed inside the lamp tube and configured to transmit the light emitted from the LED light sources, and a reflective film layer disposed on an inner circumferential surface of the lamp tube. The reflective film layer is configured to partially occupy the inner circumferential surface of the lamp tube along a longitudinal direction and a circumferential direction of the lamp tube, and the diffusion film layer is a sheet disposed to cover the LED light sources without making direct contact with the LED light sources.

18 Claims, 21 Drawing Sheets

Related U.S. Application Data continuation-in-part of application No. 14/677,899, filed on Apr. 2, 2015, now Pat. No. 9,625,129.

(30) Foreign Application Priority Data

| Nov. 6, 2014 | (CN) | .......................... 2014 1 0623355 |
| Dec. 5, 2014 | (CN) | .......................... 2014 1 0734425 |
| Feb. 12, 2015 | (CN) | .......................... 2015 1 0075925 |
| Mar. 27, 2015 | (CN) | .......................... 2015 1 0136796 |

(51) Int. Cl.

| *F21V 7/22* | (2018.01) |
| *F21V 3/02* | (2006.01) |
| *F21K 9/278* | (2016.01) |
| *F21S 4/24* | (2016.01) |
| *F21V 23/06* | (2006.01) |
| *F21K 9/275* | (2016.01) |
| *F21Y 115/10* | (2016.01) |
| *F21Y 103/10* | (2016.01) |
| *F21K 9/272* | (2016.01) |

(52) U.S. Cl.
CPC .................. *F21V 3/02* (2013.01); *F21V 7/22* (2013.01); *F21V 23/06* (2013.01); *F21K 9/272* (2016.08); *F21Y 2103/10* (2016.08); *F21Y 2115/10* (2016.08)

(58) Field of Classification Search
CPC .......... F21V 3/02; F21V 7/22; F21Y 2103/10; F21Y 2115/10
See application file for complete search history.

(56) References Cited

U.S. PATENT DOCUMENTS

| 4,156,265 | A | 5/1979 | Rose | |
| 4,647,399 | A | 3/1987 | Peters et al. | |
| 5,575,459 | A | 11/1996 | Anderson | |
| 5,921,660 | A | 7/1999 | Yu | |
| 6,118,072 | A | 9/2000 | Scott | |
| 6,127,783 | A | 10/2000 | Pashley | |
| 6,186,649 | B1 * | 2/2001 | Zou | F21V 7/005 362/217.05 |
| 6,211,262 | B1 | 4/2001 | Mejiritski et al. | |
| 6,246,167 | B1 | 6/2001 | Sica | |
| 6,609,813 | B1 | 8/2003 | Showers | |
| 6,796,680 | B1 | 9/2004 | Showers | |
| 6,860,628 | B2 | 3/2005 | Robertson et al. | |
| 6,936,855 | B1 | 8/2005 | Harrah et al. | |
| 7,033,239 | B2 | 4/2006 | Cunkelman | |
| 7,067,032 | B1 | 6/2006 | Bremont et al. | |
| 7,534,002 | B2 * | 5/2009 | Yamaguchi | F21K 9/232 362/256 |
| 7,594,738 | B1 | 9/2009 | Lin et al. | |
| 8,360,599 | B2 * | 1/2013 | Ivey | F21V 23/06 362/218 |
| 8,376,579 | B2 * | 2/2013 | Chang | F21V 5/02 362/218 |
| 8,456,075 | B2 | 6/2013 | Axelsson | |
| 8,579,463 | B2 | 11/2013 | Clough | |
| D761,216 | S | 7/2016 | Jiang | |
| 9,447,929 | B2 | 9/2016 | Jiang | |
| D768,891 | S | 10/2016 | Jiang et al. | |
| 9,585,221 | B1 | 2/2017 | Lumixess | |
| 9,618,168 | B1 | 4/2017 | Jiang et al. | |
| D797,323 | S | 9/2017 | Yang et al. | |
| 2002/0044456 | A1 | 4/2002 | Balestriero | |
| 2003/0189829 | A1 | 10/2003 | Shimizu et al. | |
| 2003/0231485 | A1 | 12/2003 | Chien | |
| 2004/0095078 | A1 | 5/2004 | Leong | |
| 2004/0189218 | A1 | 9/2004 | Leong | |
| 2005/0128751 | A1 | 6/2005 | Roberge | |
| 2005/0162850 | A1 | 7/2005 | Luk | |
| 2005/0168123 | A1 | 8/2005 | Taniwa | |
| 2005/0185396 | A1 | 8/2005 | Kutler | |
| 2005/0207166 | A1 | 9/2005 | Kan | |
| 2005/0213321 | A1 | 9/2005 | Lin | |
| 2006/0028837 | A1 | 2/2006 | Mrakovich et al. | |
| 2007/0001709 | A1 | 1/2007 | Shen | |
| 2007/0145915 | A1 | 6/2007 | Roberge | |
| 2007/0210687 | A1 | 9/2007 | Axelsson | |
| 2007/0274084 | A1 | 11/2007 | Kan | |
| 2008/0030981 | A1 | 2/2008 | Mrakovich | |
| 2008/0192476 | A1 | 8/2008 | Hiratsuka | |
| 2008/0278941 | A1 | 11/2008 | Logan | |
| 2008/0290814 | A1 | 11/2008 | Leong et al. | |
| 2008/0302476 | A1 | 12/2008 | Bommi et al. | |
| 2009/0140271 | A1 | 6/2009 | Sah | |
| 2009/0159919 | A1 | 6/2009 | Simon et al. | |
| 2009/0161359 | A1 | 6/2009 | Siemiet | |
| 2009/0323334 | A1 * | 12/2009 | Roberts | F21V 5/002 362/247 |
| 2010/0085772 | A1 | 4/2010 | Song et al. | |
| 2010/0177532 | A1 | 7/2010 | Simon et al. | |
| 2010/0201269 | A1 | 8/2010 | Tzou et al. | |
| 2010/0220469 | A1 * | 9/2010 | Ivey | F21K 9/27 362/218 |
| 2010/0253226 | A1 | 10/2010 | Oki | |
| 2010/0277918 | A1 | 11/2010 | Chen et al. | |
| 2011/0038146 | A1 | 2/2011 | Chen | |
| 2011/0057572 | A1 | 3/2011 | Kit et al. | |
| 2011/0058358 | A1 * | 3/2011 | Soo | F21S 8/02 362/147 |
| 2011/0084554 | A1 | 4/2011 | Tian et al. | |
| 2011/0084608 | A1 | 4/2011 | Lin et al. | |
| 2011/0084627 | A1 | 4/2011 | Sloan et al. | |
| 2011/0090684 | A1 | 4/2011 | Logan | |
| 2011/0175536 | A1 | 6/2011 | Fujita et al. | |
| 2011/0216538 | A1 | 9/2011 | Logan | |
| 2011/0279063 | A1 | 11/2011 | Wang et al. | |
| 2011/0309745 | A1 | 12/2011 | Westermarck | |
| 2012/0049684 | A1 | 3/2012 | Bodenstein et al. | |
| 2012/0051039 | A1 | 3/2012 | Chang | |
| 2012/0069556 | A1 * | 3/2012 | Bertram | F21V 23/02 362/217.14 |
| 2012/0106157 | A1 | 5/2012 | Simon | |
| 2012/0146503 | A1 | 6/2012 | Negley | |
| 2012/0153873 | A1 | 6/2012 | Hayashi | |
| 2012/0169968 | A1 | 7/2012 | Ishimori et al. | |
| 2012/0253226 | A1 | 10/2012 | Parihar et al. | |
| 2012/0293991 | A1 | 11/2012 | Lin | |
| 2012/0319150 | A1 | 12/2012 | Shimomura et al. | |
| 2013/0021809 | A1 | 1/2013 | Dellian et al. | |
| 2013/0033881 | A1 | 2/2013 | Terazawa et al. | |
| 2013/0033888 | A1 | 2/2013 | Wel et al. | |
| 2013/0050998 | A1 | 2/2013 | Chu et al. | |
| 2013/0069538 | A1 | 3/2013 | So | |
| 2013/0094200 | A1 | 4/2013 | Dellian et al. | |
| 2013/0135852 | A1 | 5/2013 | Chan | |
| 2013/0148349 | A1 * | 6/2013 | Pasqualini | F21V 14/006 362/235 |
| 2013/0170196 | A1 | 7/2013 | Huang et al. | |
| 2013/0170245 | A1 | 7/2013 | Hong | |
| 2013/0182425 | A1 | 7/2013 | Seki | |
| 2013/0223053 | A1 | 8/2013 | Liu et al. | |
| 2013/0230995 | A1 | 9/2013 | Ivey et al. | |
| 2013/0250565 | A1 | 9/2013 | Chiang et al. | |
| 2013/0256704 | A1 | 10/2013 | Hsiao et al. | |
| 2013/0258650 | A1 | 10/2013 | Sharrah | |
| 2013/0293098 | A1 * | 11/2013 | Li | F21V 3/02 313/512 |
| 2014/0071667 | A1 | 3/2014 | Hayashi | |
| 2014/0153231 | A1 | 6/2014 | Bittmann | |
| 2014/0192526 | A1 | 7/2014 | Qiu | |
| 2014/0225519 | A1 | 8/2014 | Yu | |
| 2014/0226320 | A1 | 8/2014 | Halliwell | |
| 2015/0009688 | A1 | 1/2015 | Timmermans | |
| 2015/0176770 | A1 | 6/2015 | Wilcox et al. | |
| 2015/0327368 | A1 | 11/2015 | Su | |
| 2016/0091147 | A1 | 3/2016 | Jiang et al. | |
| 2016/0091156 | A1 | 3/2016 | Li et al. | |

(56) References Cited

U.S. PATENT DOCUMENTS

| | | |
|---|---|---|
| 2016/0091179 A1 | 3/2016 | Jiang et al. |
| 2016/0102813 A1 | 4/2016 | Ye et al. |
| 2016/0178135 A1 | 6/2016 | Xu et al. |
| 2016/0178137 A1 | 6/2016 | Jiang |
| 2016/0178138 A1 | 6/2016 | Jiang |
| 2016/0198535 A1 | 7/2016 | Ye et al. |
| 2016/0212809 A1 | 7/2016 | Xiong et al. |
| 2016/0215936 A1 | 7/2016 | Jiang |
| 2016/0215937 A1 | 7/2016 | Jiang |
| 2016/0219658 A1 | 7/2016 | Xiong et al. |
| 2016/0219666 A1 | 7/2016 | Xiong et al. |
| 2016/0219672 A1 | 7/2016 | Liu |
| 2016/0223180 A1 | 8/2016 | Jiang |
| 2016/0223182 A1 | 8/2016 | Jiang |
| 2016/0229621 A1 | 8/2016 | Jiang et al. |
| 2016/0255694 A1 | 9/2016 | Jiang et al. |
| 2016/0255699 A1 | 9/2016 | Ye et al. |
| 2016/0270163 A1 | 9/2016 | Hu et al. |
| 2016/0270164 A1 | 9/2016 | Xiong et al. |
| 2016/0270165 A1 | 9/2016 | Xiong et al. |
| 2016/0270166 A1 | 9/2016 | Xiong et al. |
| 2016/0270173 A1 | 9/2016 | Xiong |
| 2016/0270184 A1 | 9/2016 | Xiong et al. |
| 2016/0290566 A1 | 10/2016 | Jiang et al. |
| 2016/0290567 A1 | 10/2016 | Jiang et al. |
| 2016/0290568 A1 | 10/2016 | Jiang et al. |
| 2016/0290569 A1 | 10/2016 | Jiang et al. |
| 2016/0290570 A1 | 10/2016 | Jiang et al. |
| 2016/0290598 A1 | 10/2016 | Jiang |
| 2016/0290609 A1 | 10/2016 | Jiang et al. |
| 2016/0295706 A1 | 10/2016 | Jiang |
| 2016/0309550 A1 | 10/2016 | Xiong et al. |
| 2016/0323948 A1 | 11/2016 | Xiong et al. |
| 2016/0341414 A1 | 11/2016 | Jiang |
| 2016/0356472 A1 | 12/2016 | Liu et al. |
| 2016/0363267 A1 | 12/2016 | Jiang et al. |
| 2016/0381746 A1 | 12/2016 | Ye et al. |
| 2016/0381760 A1 | 12/2016 | Xiong et al. |
| 2017/0001793 A1 | 1/2017 | Jiang et al. |
| 2017/0038012 A1 | 2/2017 | Jiang et al. |
| 2017/0038013 A1 | 2/2017 | Liu et al. |
| 2017/0038014 A1 | 2/2017 | Jiang et al. |
| 2017/0089521 A1 | 3/2017 | Jiang |
| 2017/0130911 A1 | 5/2017 | Li et al. |
| 2017/0159894 A1 | 6/2017 | Jiang |
| 2017/0167664 A1 | 6/2017 | Li et al. |
| 2017/0211753 A1 | 7/2017 | Jiang et al. |
| 2017/0219169 A1 | 8/2017 | Jiang |
| 2017/0311398 A1 | 10/2017 | Jiang et al. |

FOREIGN PATENT DOCUMENTS

| | | |
|---|---|---|
| CN | 201014273 Y | 1/2008 |
| CN | 101228393 A | 7/2008 |
| CN | 201363601 | 12/2009 |
| CN | 201437921 | 4/2010 |
| CN | 102052652 | 5/2011 |
| CN | 102116460 | 7/2011 |
| CN | 102121578 | 7/2011 |
| CN | 201954169 U | 8/2011 |
| CN | 202120982 U | 1/2012 |
| CN | 202125774 | 1/2012 |
| CN | 102359697 | 2/2012 |
| CN | 102359697 A | 2/2012 |
| CN | 202216003 | 5/2012 |
| CN | 102518972 | 6/2012 |
| CN | 202302841 | 7/2012 |
| CN | 102720901 | 10/2012 |
| CN | 102777788 | 11/2012 |
| CN | 102889446 | 1/2013 |
| CN | 202791824 U | 3/2013 |
| CN | 103016984 A | 4/2013 |
| CN | 202852551 | 4/2013 |
| CN | 103195999 A | 7/2013 |
| CN | 203068187 | 7/2013 |
| CN | 201866575 U | 10/2013 |
| CN | 203240337 | 10/2013 |
| CN | 203240337 U | 10/2013 |
| CN | 203240362 U | 10/2013 |
| CN | 203363984 | 12/2013 |
| CN | 203384716 U | 1/2014 |
| CN | 203413396 U | 1/2014 |
| CN | 203453866 U | 2/2014 |
| CN | 203464014 | 3/2014 |
| CN | 103742875 | 4/2014 |
| CN | 203517629 U | 4/2014 |
| CN | 203549435 | 4/2014 |
| CN | 203585876 U | 5/2014 |
| CN | 203615157 | 5/2014 |
| CN | 103851547 | 6/2014 |
| CN | 103943752 A | 7/2014 |
| CN | 203771102 | 8/2014 |
| CN | 104033772 | 9/2014 |
| CN | 203927469 | 11/2014 |
| CN | 203963553 U | 11/2014 |
| CN | 204042527 | 12/2014 |
| CN | 204083927 U | 1/2015 |
| CN | 204201535 U | 3/2015 |
| CN | 204268162 | 4/2015 |
| CN | 204300737 | 4/2015 |
| CN | 104595765 | 5/2015 |
| CN | 204420636 | 6/2015 |
| CN | 104776332 | 7/2015 |
| CN | 104832813 A | 8/2015 |
| CN | 204573639 | 8/2015 |
| DE | 202012011550 | 4/2013 |
| EP | 2554899 | 2/2013 |
| EP | 3146803 | 3/2017 |
| GB | 2519258 | 4/2015 |
| GB | 2523275 | 8/2015 |
| GB | 2531425 | 4/2016 |
| JP | 2005112906 | 5/2005 |
| JP | 2008117666 | 5/2008 |
| JP | 3147313 U | 12/2008 |
| JP | 2011061056 | 3/2011 |
| JP | 2013254667 A | 12/2013 |
| JP | 2014154479 | 8/2014 |
| KR | 20090118147 | 11/2009 |
| KR | 20120000551 | 1/2012 |
| KR | 1020120055349 | 5/2012 |
| WO | 2009111098 A2 | 9/2009 |
| WO | WO2011/132120 | 10/2011 |
| WO | WO2012129301 | 9/2012 |
| WO | WO2013/125803 | 8/2013 |
| WO | WO2014/001475 | 1/2014 |
| WO | WO 2014/118754 | 8/2014 |
| WO | WO2014117435 | 8/2014 |
| WO | WO2015/036478 | 3/2015 |
| WO | WO2015081809 | 6/2015 |
| WO | WO2016086901 | 6/2016 |

\* cited by examiner

LED TUBE LAMP

PRIOR APPLICATION STATUS

This application is a Continuation of and claims priority to U.S. patent application Ser. No. 14/724,840, filed May 29, 2015, the contents of which are incorporated in their entirety by reference herein, which is a Continuation-in-Part of and claims priority to U.S. patent application Ser. No. 14/677,899, filed Apr. 2, 2015. U.S. patent application Ser. No. 14/677,899 claims priority to Chinese Patent Application Nos.: CN 201410734425.5, filed Dec. 5, 2014; CN 201410623355.6, filed Nov. 6, 2014; CN 201410508899.8, filed Sep. 28, 2014; CN 201410507660.9, filed Sep. 28, 2014; and CN 2015/10075925.7, filed Feb. 12, 2015, and U.S. patent application Ser. No. 14/724,840 claims priority to the above Chinese Patent Applications and additionally claims priority to Chinese Patent Application No.: CN 201510136796.8, filed Mar. 27, 2015.

BACKGROUND OF THE INVENTION

Today LED lighting technology is rapidly replacing traditional incandescent and fluorescent lights. Even in the tube lighting applications, instead of being filled with inert gas and mercury as found in fluorescent tube lights, the LED tube lights are mercury-free. Thus, it is no surprise that LED tube lights are becoming a highly desired illumination option among different available lighting systems used in homes and workplace, which used to be dominated by traditional lighting options such as compact fluorescent light bulbs (CFLs) and fluorescent tube lights. Benefits of the LED tube lights include improved durability and longevity, and far less energy consumption, therefore, when taking into account of all factors, they would be considered a cost effective lighting option.

There are several types of LED tube lights that are currently available on the market today. Many of the conventional LED tube lights have a housing that uses material such as an aluminum alloy combined with a plastic cover, or made of all-plastic tube construction. The lighting sources usually adopt multiple rows of assembled individual chip LEDs (single LED per chip) being welded on circuit boards, and the circuit boards are secured to the heat dissipating housing. Because this type of aluminum alloy housing is a conductive material, thus is prone to result in electrical shock accidents to users. In addition, the light transmittance of the plastic cover or the plastic tube diminishes over time due to aging, thereby reducing the overall lighting or luminous efficiency of the conventional LED tube light. Furthermore, grainy visual appearance and other derived problems reduce the luminous efficiency, thereby reducing the overall effectiveness of the use of LED tube lights.

Referring to US patent publication no. 2014/0226320, as an illustrative example of a conventional LED tube light, the two ends of the tube are not curved down to allow the end caps at the connecting region to connect with the body of the lamp tube (including a lens, which typically is made of glass or clear plastic) having a transition region. During shipping or transport of the LED lamp tube, the shipping packaging support/bracket only makes contact with the end caps, thus rendering the end caps as being the only load/stress points, which can easily lead to breakage at the transition region with the glass lens.

With regards to the conventional technology directed to glass tubes of LED tube lamps, typically, an LED chip on a board is mounted inside the glass-tubed tube lamp by means of adhesive. The end caps are made of a plastic material, and are also secured to the glass tube using adhesive, and at the same time the end cap is electrically connected to the power supply inside tube lamp and to the LED chip on boards. This type of LED tube lamp assembly technique resolves the issue relating to electrical shocks caused by the housing and poor luminous transmittance issues. But this type of conventional tube lamp configured with the plastic end caps requires a tedious process for performing adhesive bonding attachment because the adhesive bonding process requires a significant amount of time to perform, leading to production bottleneck or difficulties. In addition, manual operation or labor may be required to perform such an adhesive bonding process, thus would be difficult for manufacturing optimization using automation.

In addition, the glass tube is a fragile breakable part, thus when the glass tube is partially broken in certain portions thereof, a person would possibly contact the internal LED chip on boards when illuminated, causing electrical shock incidents. Referring to Chinese patent publication no. 102518972, which discloses the connection structure of lamp caps and a glass tube, as shown in FIG. 1 of the aforementioned Chinese patent reference, it can be seen that the lamp end cap protrudes outward at the joining location with the glass tube, which is commonly done in the conventional market place. According to conducted studies, during the shipping process of the LED tube lamps, the shipping packaging support/bracket only makes contact with the lamp end caps, which make the end caps as being the only load/stress points, which can easily lead to breakage at the transition coupling regions at the ends of the glass tube. In addition, with regard to the secure mounting method of the lamp end caps and the glass tube, regardless of whether using hot melt adhesive or silicone adhesive, it is hard to prevent the buildup and light blockage of excess (overflown) leftover adhesive residues, which can have an unpleasant aesthetic appearance thereof. In addition, a large amount of manpower is used for cleaning off of the excessive adhesive buildup, creating further production bottlenecks and inefficiency. As shown also from FIGS. 3 and 4 of the aforementioned Chinese patent application, the LED lighting elements and the power supply module are electrically connected via a wire bonding technique, which can be a problem or issue during shipping due to the concern of breakage.

Based on the above, it can be appreciated that the LED tube light fabricated according to the conventional assembly and fabrication methods in mass production and shipping processes can experience various quality issues. Refer to US patent publication no. 2010/0103673, which discloses an end cap substitute for sealing and inserting into the housing. However, based on various experimentation, upon exerting a force on the glass housing, breakages can easily occur, which lead to product defects and quality issues. Meanwhile, grainy visual appearances are also often found in the aforementioned conventional LED tube light.

SUMMARY

To address at least one of the above issues, the present disclosure provides a LED tube light having an LED light bar, in which the LED light bar is a bendable circuit board.

The present disclosure provides an LED tube light that includes a plurality of LED light sources, a LED light bar, a light tube, at least one end cap and at least one power supply.

The present disclosure provides the LED light bar to be disposed inside the light tube, the LED light sources are mounted on the LED light bar, the LED light sources and the power supply are electrically connected by the LED light bar.

In an embodiment of the present invention, two end caps are provided, in which each end cap is equipped with one power supply.

Certain embodiments of the present disclosure provide the chip LEDs/chip LED modules mounted and fixed on the inside wall of the glass light tube by a bonding adhesive.

In alternative embodiments, the light tube can be a plastic tube, and in several embodiments, the light tube is a glass tube.

In certain embodiments of the present disclosure, the LED light bar being the bendable circuit board includes a conductive layer and a dielectric layer, the LED light sources are disposed on the conductive layer and are electrically connected to the power supply by the conductive layer therebetween, the conductive layer and the dielectric layer are stackingly arranged, the dielectric layer is disposed on a surface of the conductive layer which is away from the LED light sources, and is fixed to an inner circumferential surface of the light tube. Furthermore, the bendable circuit board (the LED light bar) may extend along a circumferential direction of the light tube, the circumferential length of the bendable circuit board along the inner circumferential surface of the light tube and the circumferential length of the inner circumferential surface of the light tube may be at a ratio of 0.3 to 0.5. Moreover, the bendable circuit board can further include a circuit protection layer, the circuit protection layer can be of one layer, and the circuit protection layer can be disposed on an outermost layer of the conductive layer of the bendable circuit board. In another embodiment, the bendable circuit board further includes a circuit protection layer being two layers respectively disposed on outermost layers of the conductive layer and the dielectric layer of the bendable circuit board.

In certain embodiments of the present invention, the bendable circuit board can be electrically connect to the power supply by wire bonding or by soldering, so as not to be fixed to an inner circumferential surface of the light tube by forming a freely extending end portion at the two ends thereof, respectively.

Certain aspects of the present invention provide the light tube to include a main region, (optionally) a transition region, and a plurality of rear end regions (also called end regions). A diameter of the rear end regions may be less than a diameter of the main region thereof, and the end cap may be fittingly sleeved on the rear end region of the light tube. The (optional) transition region is formed between the main region and the rear end region. In one embodiment, the bendable circuit board is passed through the transition region to be electrically connected to the power supply. In example embodiments of the present invention, each of the transition regions has a length of 1 mm to 4 mm.

The present disclosure provides the LED tube light further comprising a diffusion layer and a reflective film layer, in which the diffusion layer is disposed above the LED light sources, the light emitting from the LED light sources is passed through the diffusion layer and the light tube. Furthermore, the reflective film layer is disposed on an inner circumferential surface of the light tube, and the bendable circuit board is disposed on the reflective film layer or one side of the reflective film layer. A ratio of a circumferential length of the reflective film layer fixed along an inner surface of the light tube and a circumferential length of the light tube may be 0.3 to 0.5.

The present disclosure provides another embodiment for the LED tube light, in which the LED light bar is the bendable circuit board, including a plurality of conductive layers and a plurality of dielectric layers, the dielectric layers and the conductive layers are sequentially and stacked in a staggered manner, respectively, on a surface of one conductive layer that is opposite from the surface of another conductive layer that has the LED light sources disposed thereon, the LED light sources are disposed on an uppermost layer of the conductive layers, and are electrically connected to the power support by the uppermost layer of the conductive layers.

The present disclosure provides a hot melt adhesive to bond together the end cap and the light tube, thus allowing for realization of manufacturing automation for LED tube lights.

The present disclosure provides that the power supply for the LED tube light may be in the form of a singular unit, or two individual units, and the power supply can be purchased readily from the marketplace because it is of conventional design.

The present disclosure provides the LED light bar to be adhesively mounted and secured on the inner wall of the light tube, thereby having an illumination angle of at least 330 degrees.

In one embodiment, the light tube can be a transparent glass tube, or a glass tube with coated adhesive film on the inner walls thereof.

One benefit of the LED tube light fabricated in accordance with various embodiments of present disclosure is that for an LED tube light having rigid aluminum plate or FR4 board as the LED light bar, when the light tube has been ruptured, the entire light tube still maintains a straight tube configuration, and then the user may be under a false impression the LED tube light would remain usable and fully functional. As a result, electric shock can occur upon handling or installation thereof. On the other hand, because of added flexibility and bendability of the bendable circuit board for the LED light bar according to embodiments of present invention, the problems faced by the aluminum plate, FR4 board, conventional 3-layered flexible board having inadequate flexibility and bendability are thereby addressed. Due to the adopting of the flexible substrate/bendable circuit board for the LED light bar of embodiments of present invention, the bendable circuit board (the LED light bar) renders a ruptured or broken light tube to being not able (unable) to maintain a straight pipe or tube configuration so as to better inform the user that the LED tube light is deemed unusable so as to avoid potential electric shock accidents from occurring.

Another benefit of the LED tube light fabricated in accordance with the embodiments of present invention is that the bendable circuit board (LED light bar) can have a freely extending end portion together with the soldered connection between the output terminal of the power supply, and the freely extending end portion can be coiled to be fittingly accommodating inside the light tube, so that the freely extending end portions of the bendable circuit board can be deformed in shape due to contracting or curling up to fit inside the light tube, and when using a solder bonding technique having a pad of the power supply being of different surface to one of the surfaces of the bendable circuit board that is mounted with the LED light sources, a downward tension is exerted on the power supply at the connection end of the power supply and the bendable circuit board, so that the bendable circuit board with a through-holes configured bond pad would form a stronger and more secure electrical connection between the bendable circuit board and the power supply. Another benefit of the LED tube light fabricated in accordance with certain embodiments of present invention is that the bendable circuit board allows for soldering for forming solder joints between the flexible substrate and the power supply, and the bendable circuit board can be used to pass through the transition region and be solder bonded to the output terminal of the power supply for providing electrical coupling to the power supply, so as to avoid the usage of bonding wires, and improving upon the reliability thereof.

BRIEF DESCRIPTION OF THE DRAWINGS

Various aspects of the present invention will become more readily apparent to those ordinarily skilled in the art after reviewing the following detailed description and accompanying drawings, in which.

DETAILED DESCRIPTION

The present disclosure will now be described more specifically with reference to the following embodiments. It is to be noted that the following descriptions of example embodiments of this invention are presented herein for purpose of illustration and description only. It is not intended to be exhaustive or to be limited to the precise form disclosed.

Figure 1:
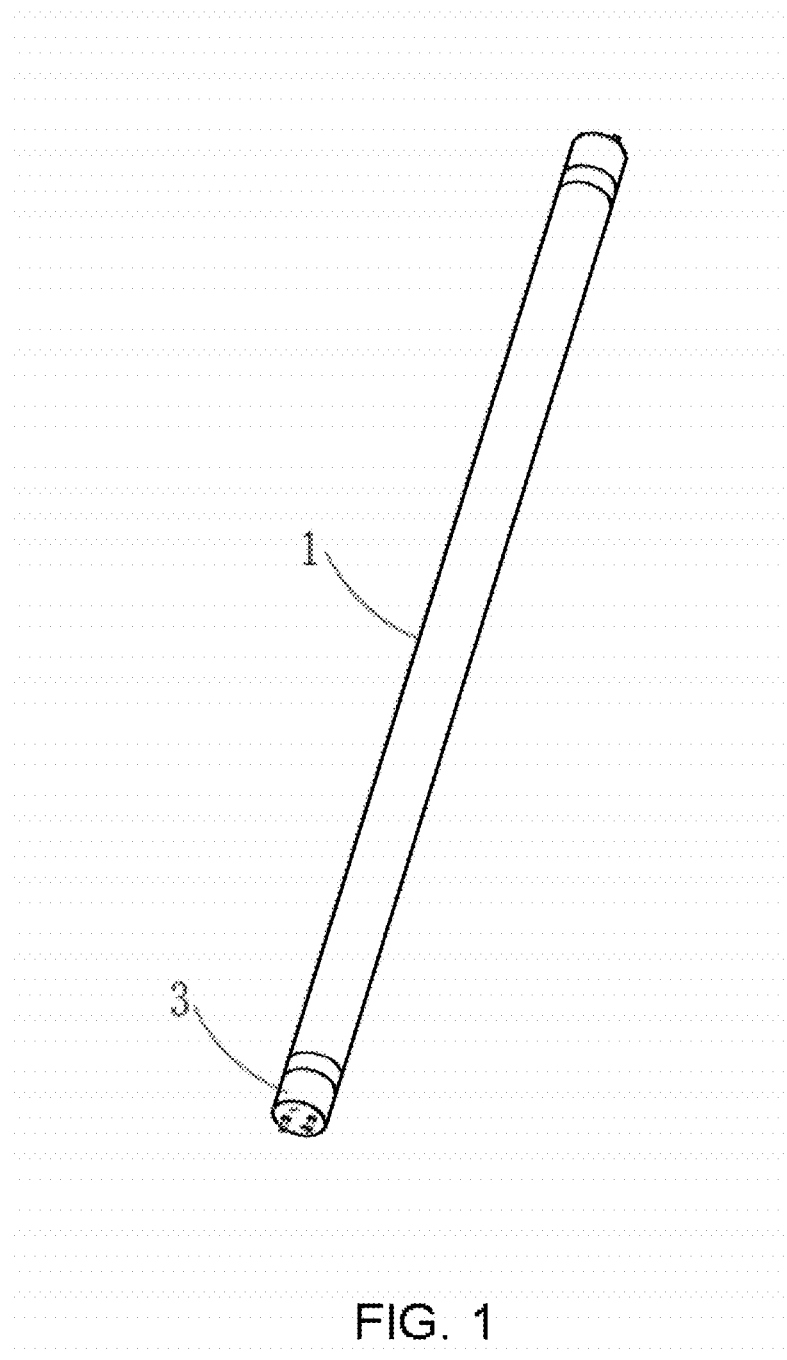
FIG. 1 is a perspective view of an LED tube light according to an embodiment of the present invention.
Figure 2:
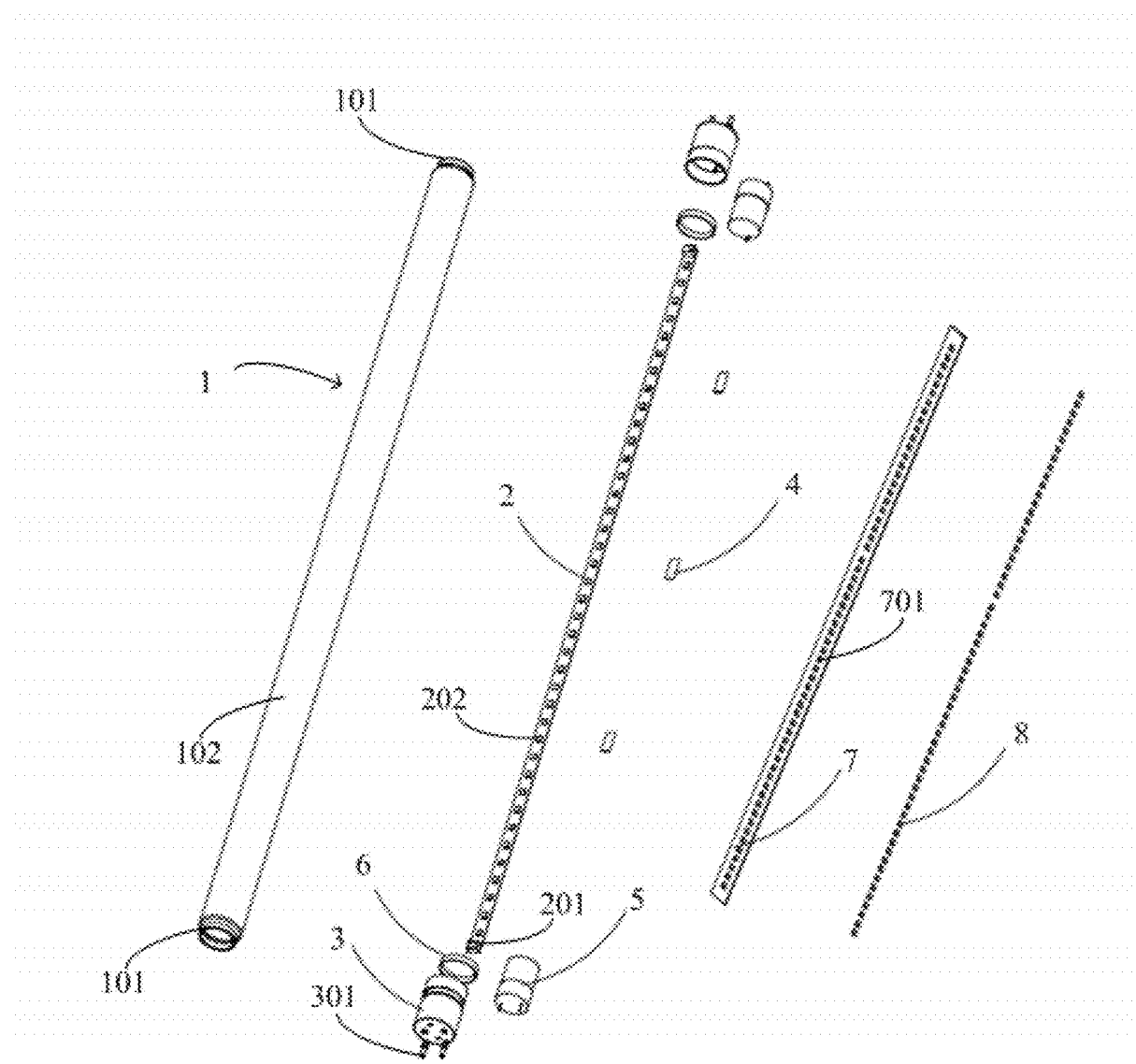
FIG. 2 is an exploded view of a disassembled LED tube light according to an embodiment of the present invention.

According to an embodiment of present invention, an LED tube light is shown in FIGS. 1 and 2, in which the LED tube light includes at least a light tube 1, an LED light bar 2, and two end caps 3. The LED light bar 2 is disposed inside the light tube 1 when assembled. The two end caps 3 are disposed at the two ends of the light tube, respectively. The light tube 1 can be made of plastic or glass.

In the present embodiment, the light tube 1 is made of tempered glass. The method for strengthening or tempering of glass tube can be done by a chemical tempering method or a physical tempering method for further processing on the glass light tube 1. For example, the chemical tempering method uses other alkali metal ions to exchange with the Na ions or K ions to be exchanged. Other alkali metal ions and the sodium (Na) ions or potassium (K) ions on the glass surface are exchanged, in which an ion exchange layer is formed on the glass surface. When cooled to room temperature, the glass is then under tension on the inside, while under compression on the outside thereof, so as to achieve the purpose of increased strength, including but not limited to the following glass tempering methods: high temperature type ion exchange method, the low temperature type ion exchange method, dealkalization, surface crystallization, sodium silicate strengthening method. High-temperature ion exchange method includes the following steps. First, glass containing sodium oxide ($Na_2O$) or potassium oxide ($K_2O$)

in the temperature range of the softening point and glass transition point are inserted into molten salt of lithium, so that the Na ions in the glass are exchanged for Li ions in the molten salt. Later, the glass is then cooled to room temperature, since the surface layer containing Li ions has a different expansion coefficient with respect to the inner layer containing Na ions or K ions, thus the surface produces residual stress and is reinforced. Meanwhile, the glass containing $AL_2O_3$, $TiO_2$ and other components, by performing ion exchange, can produce glass crystals of extremely low coefficient of expansion. The crystallized glass surface after cooling produces significant amount of pressure, up to 700 MPa, which can enhance the strength of glass. A low-temperature ion exchange method includes the following steps: First, a monovalent cation (e.g., K ions) undergoes ion exchange with the alkali ions (e.g. Na ion) on the surface layer at a temperature range that is lower than the strain point temperature, so as to allow the K ions penetrating the surface. For example, for manufacturing a $Na_2O+CaO+SiO_2$ system glass, the glass can be impregnated for ten hours at more than four hundred degrees in the molten salt. The low temperature ion exchange method can easily obtain glass of higher strength, and the processing method is simple, does not damage the transparent nature of the glass surface, and not undergo shape distortion. Dealkalization includes treating glass using a platinum (Pt) catalyst along with sulfurous acid gas and water in a high temperature atmosphere. The Na+ ions are migrated out and bleed from the glass surface to be reacted with the Pt catalyst, so that the surface layer becomes a $SiO_2$ enriched layer, which results in being a low expansion glass and produces compressive stress upon cooling. A surface crystallization method and the high temperature type ion exchange method are different, but only the surface layer is treated by heat treatment to form low expansion coefficient microcrystals on the glass surface, thus reinforcing the glass. A sodium silicate glass strengthening method is a tempering method using sodium silicate (water glass) in water solution at 100 degrees Celsius and several atmospheres of pressure treatment, where a stronger/higher strength glass surface that is harder to scratch is thereby produced. The above-described glass tempering methods include physical tempering methods and chemical tempering methods, in which various combinations of different tempering methods can also be combined together.

Figure 3:
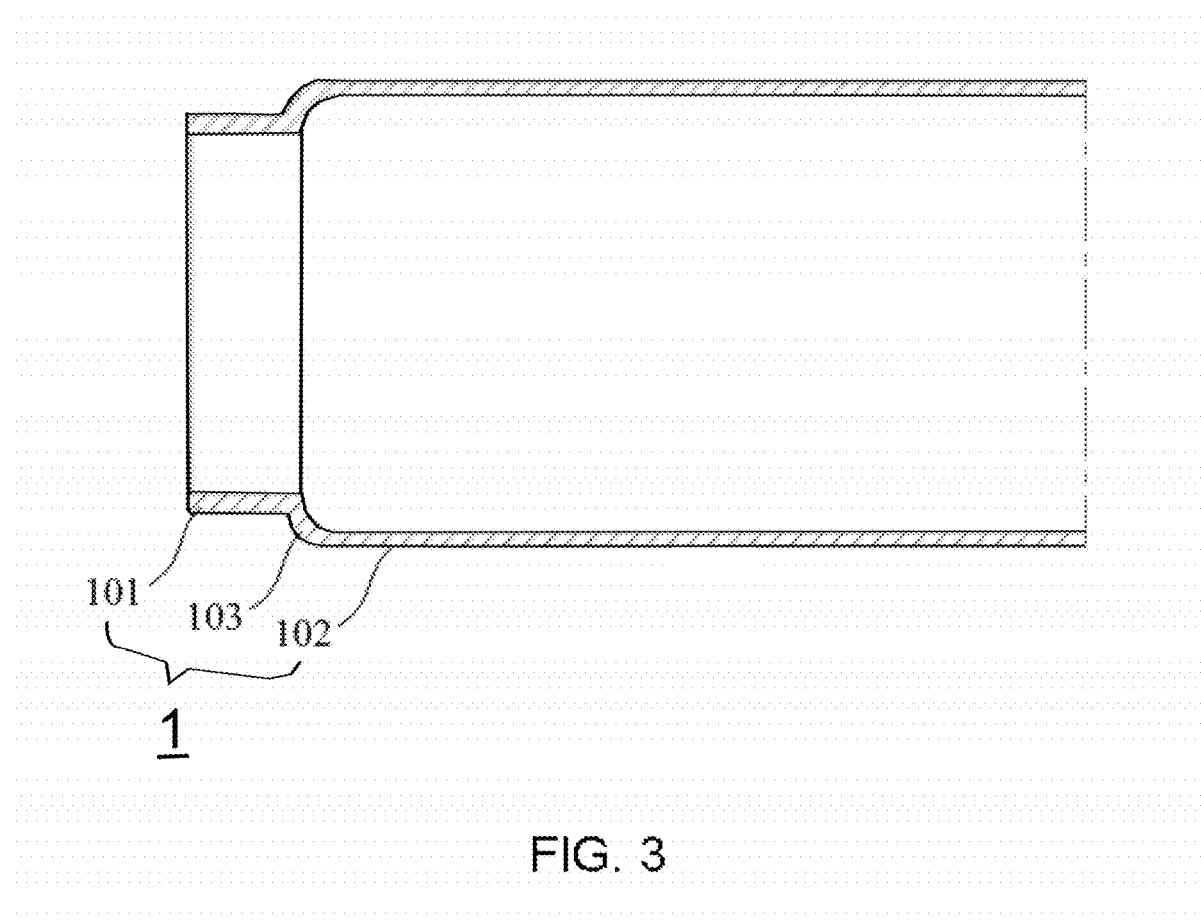
FIG. 3 is a cross-sectional partial view of a light tube of the LED tube light of embodiments of the present invention at one end region thereof.
Figure 7:
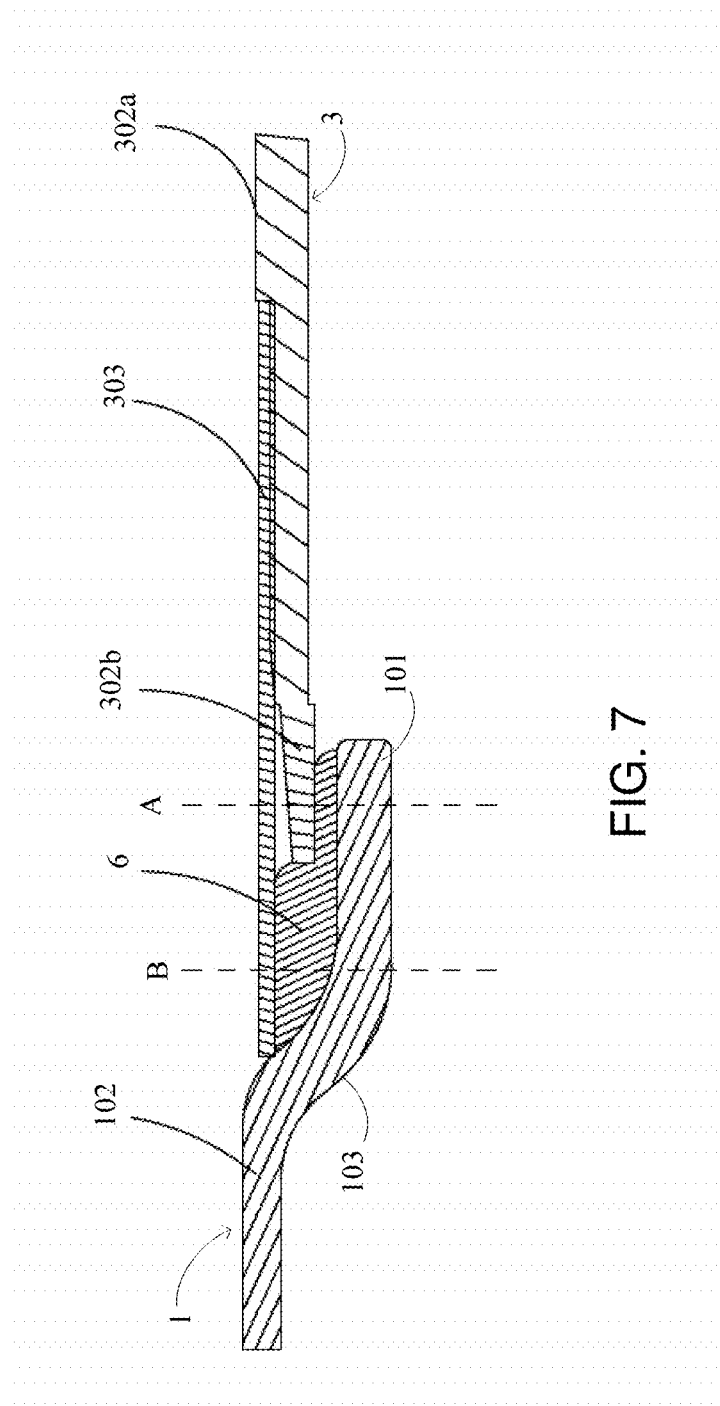
FIG. 7 is a cross-sectional partial view of a connecting region of the end cap and the light tube of an embodiment of the present invention.
Figure 9:
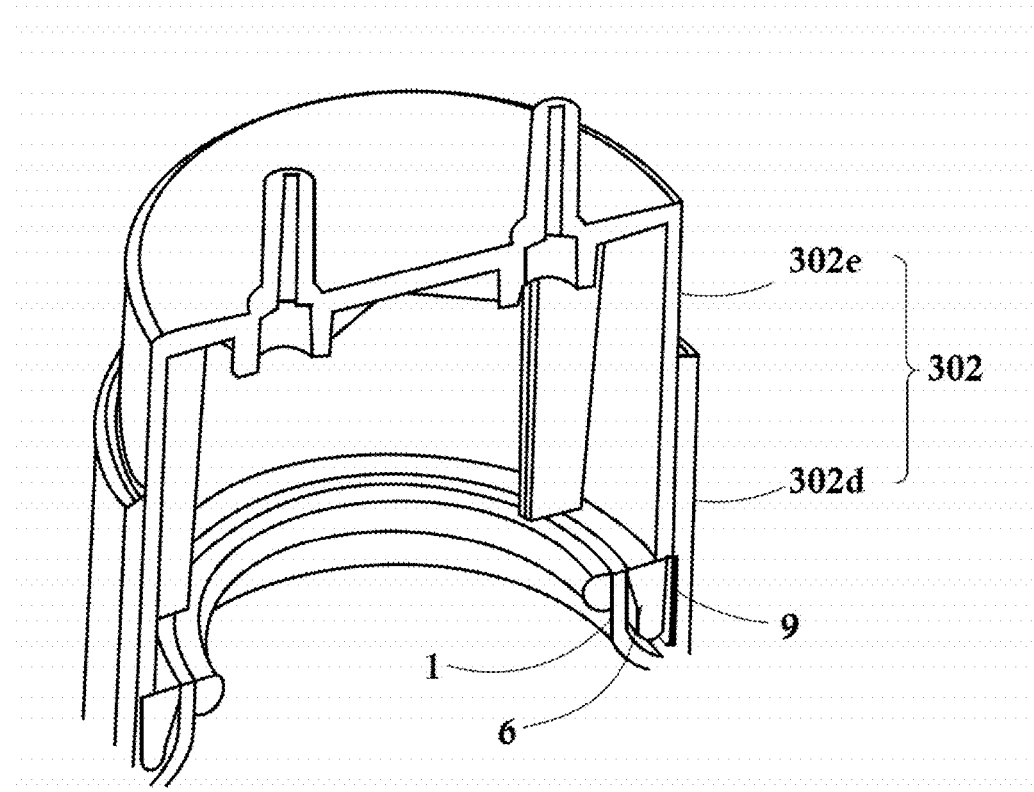
FIG. 9 is a perspective sectional schematic partial view of the all-plastic end cap of FIG. 8 showing internal structure thereof.

In the illustrated embodiment as shown in FIG. 3, the light tube 1 includes a main region 102, a plurality of rear end regions 101 (also described as end regions 101), and a plurality of transition regions 103. The light tube 1 is fabricated by undergoing a glass shaping process so as to form one or more narrowly curved end regions at one or more ends thereof, in which each narrowly curved end region includes one rear end region 101 and one transition region 103, from a cylindrical raw light tube. At the same time, the glass shaping process coincides to be substantially concurrently or is the same as a glass toughening or tempering treatment process. For example, in one embodiment, while the light tube 1 is toughened or tempered, the narrowly curved end regions as shown in FIG. 3 are also shaped alongside at the same time. Each transition region 103 is located between an end of the main region 102 and one rear end region 101. The rear end region 101 is connected to one end of the transition region 103, and the other end of the transition region 103 is connected to one end of the main region 102. In the illustrated embodiment, the number of the rear end regions 101 and the number of the transition regions 103 are two, respectively. The transition region 103 is curved or arc-shaped at both ends thereof under cross-sectional view. As illustrated in FIGS. 7 and 9, one end cap 3 is sleeved over the rear end region 101. The outer diameter of the rear end region 101 is less than the outer diameter of the main region 102. After undergoing a glass toughening or tempering treatment process, the rear end regions 101 of the light tube 1 are formed to be a plurality of toughened glass structural portions. The end cap 3 is sleeved over the rear end region 101 (which is a toughened glass structural portion). The outer diameter of the end cap 3 is the same as the outer diameter of the main region 102 of the light tube 1.

Figure 4:
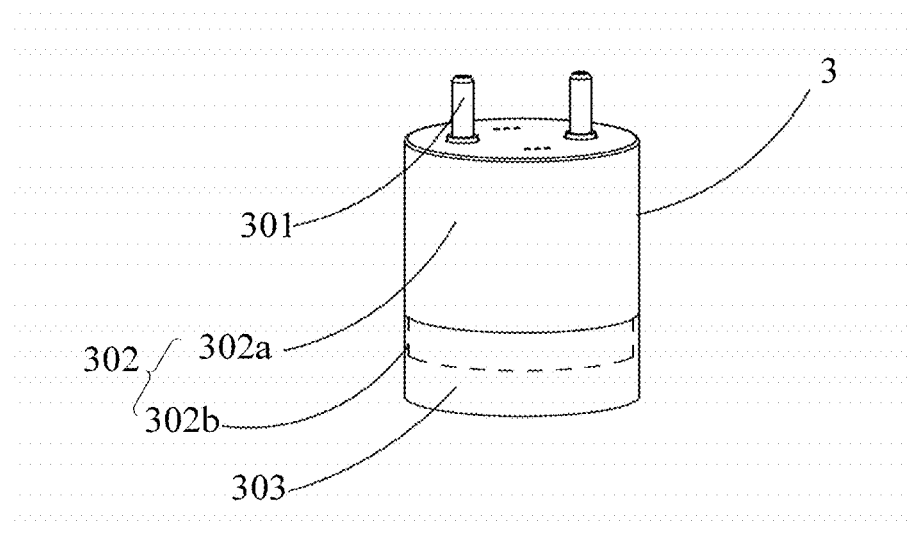
FIG. 4 is a frontal perspective schematic view of an end cap according to an embodiment of the LED tube light.
Figure 5:
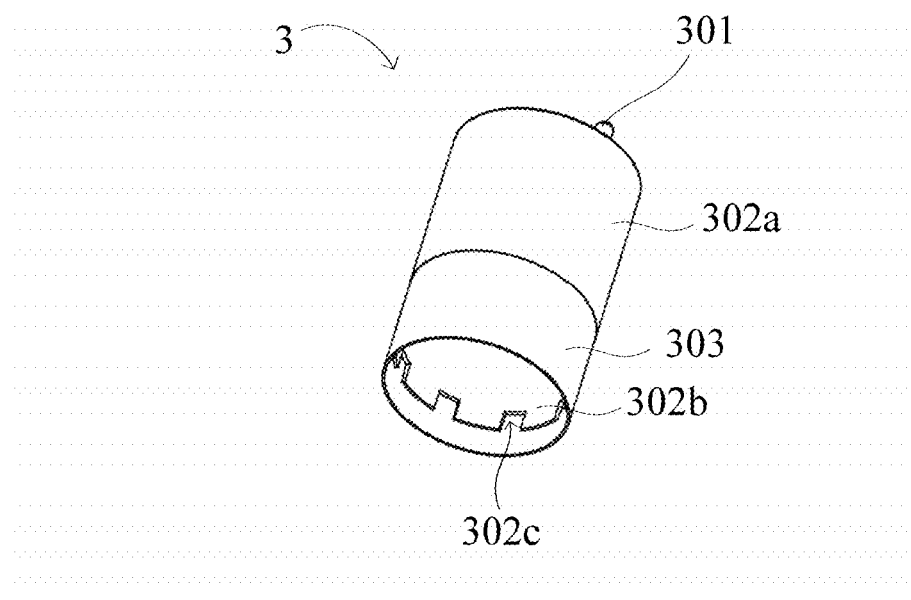
FIG. 5 is a bottom perspective view of another embodiment of the end cap, showing the inside structure thereof.
Figure 6:
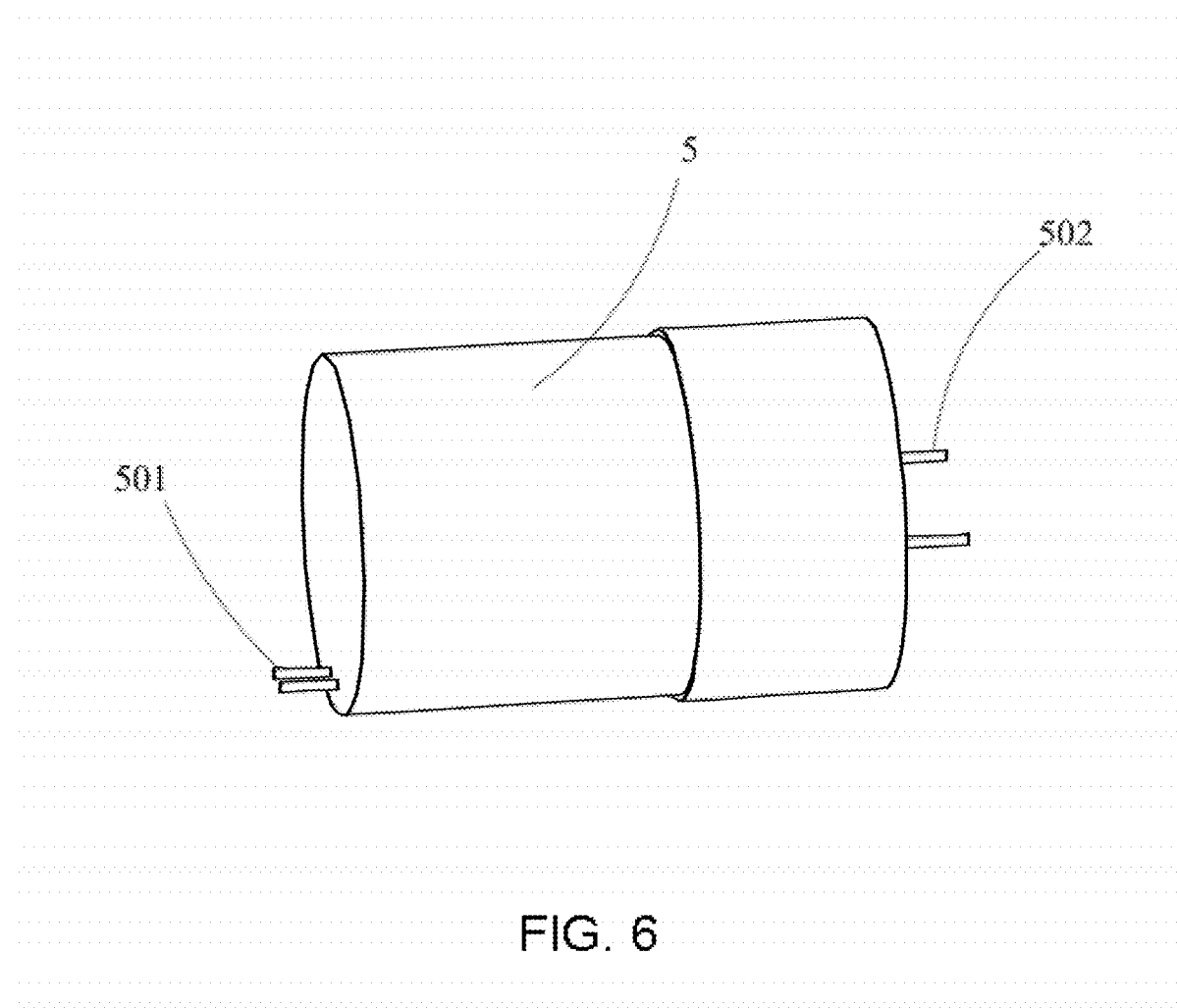
FIG. 6 is a side perspective view of a power supply of the LED tube light according to an embodiment of the present invention.

Referring to FIGS. 4 and 5, in some embodiments, each end cap 3 includes a plurality of hollow conductive pins 301, an insulating tubular part 302 and a thermal conductive ring 303. The thermal conductive ring 303 can be a metal ring that is tubular in shape. The thermal conductive ring 303 is sleeved over the insulating tubular part 302. The hollow conductive pins 301 are disposed on the insulating tubular part 302. As shown in FIG. 7, in one embodiment, one end of the thermal conductive ring 303 protrudes away from the insulating tubular part 302 of the end cap 3 towards one end of the light tube 1, of which is bonded and adhered using a hot melt adhesive 6. As illustrated, the hot melt adhesive 6 forms a pool and then solidifies to fittingly join together the rear end region 101 and a portion of the transition region 103 of the light tube 1 to a portion of the thermal conductive ring 303 and a portion of the insulating tubular part 302 of the end cap 3. As a result, the end cap 3 is then joined to one end of the light tube 1 using the hot melt adhesive 6. The thermal conductive ring 303 of the end cap 3 extends to the transition region 103 of the light tube 1. The outer diameter of the thermal conductive ring 303 is substantially the same as the outer diameter of the main region 102 of the light tube 1, and the outer diameter of the thermal conductive ring 303 is also substantially the same as the outer diameter of the insulating tubular part 302. The insulating tubular part 302 facing toward the light tube 1 and the transition region 103 has a gap therebetween. As a result, the LED tube light has a substantially uniform exterior diameter from end to end thereof. Because of the substantially uniform exterior diameter of the LED tube light, the LED tube light has uniformly distributed stress point locations covering the entire span of the LED tube light (in contrast with conventional LED tube lights which have different diameters between the end caps and the light tube, and often utilize packaging that only contacts the end caps 3 (of larger diameter), but not the light tube 1 of reduced diameter). Therefore, the packaging design configured for shipping of the light tube 1 of one embodiment of present invention can include more evenly distributed contact stress points at many more locations covering the entire span of the LED tube light, up to contacting along the entire outer surface of the LED tube light 1.

In the present embodiment, the outer diameter of the end caps 3 are the same as the outer diameter of the main region 102, and the tolerance for the outer diameter measurements thereof are preferred to be within +/−0.2 millimeter (mm), and should not exceed +/−1.0 millimeter (mm). The outer diameter difference between the rear end region 101 and the main region 102 can be 1 mm to 10 mm for typical product applications. Meanwhile, for preferred embodiment, the outer diameter difference between the rear end region 101 and the main region 102 can be 2 mm to 7 mm. The length of the transition region 103 is from 1 mm to 4 mm. Upon experimentation, it was found that when the length of the transition region 103 is either less than 1 mm or more than 4 mm, problems would arise due to insufficient strength or reduction in light illumination surface of the light tube. In alternative embodiments, the transition region 103 can be without a curve or arc in shape. Upon adopting the T8 standard lamp format as an example, the outer diameter of the rear end region 101 is configured between 20.9 mm to 23 mm. Meanwhile, if the outer diameter of the rear end region 101 is less than 20.9 mm, the inner diameter of the rear end region 101 would be too small, thus rendering inability of the power supply to be fittingly inserted into the light tube 1. The outer diameter of the main region 102 is preferably configured to be between 25 mm to 28 mm.

Referring to FIG. 2, the LED light bar 2 of one embodiment of the present invention has a plurality of LED light sources 202 mounted thereon. The end cap 3 has a power supply 5 installed therein. The LED light sources 202 and the power supply 5 are electrically connected by the LED light bar 2. The power supply 5 may be in the form of a single individual unit (i.e., all of the power supply components are integrated into one module unit), and to be installed in one end cap 3. Alternatively, the power supply 5 may be divided into two separate units (i.e. all of the power supply components are divided into two parts) which are installed at the end caps 3, respectively. The number of units of the power supply 5 in one embodiment corresponds to the number of the ends of the light tube 1 which had undergone glass tempering and strengthening process. In addition, in some embodiments, the location of the power supply also corresponds to the location of the light tube 1 which had undergone glass tempering. The power supply can be fabricated by encapsulation molding by using a high thermal conductivity silica gel (with thermal conductivity ≥0.7 w/m·k), or fabricated in the form of exposed power supply electronic components that are packaged by conventional heat shrink sleeved to be placed into the end cap 3. Referring to FIG. 2 and FIGS. 4-6, the power supply 5 includes a male plug 501 and a metal pin 502. The male plug 501 and the metal pin 502 are located at opposite ends of the power supply 5. The LED light bar 2 is configured with a female plug 201 at an end thereof. The end cap 3 is configured with a hollow conductive pin 301 used for coupling with an external power source. The male plugs 501 of the power supply 5 are fittingly engaged into the female plug 201 of the LED light bar 2, while the metal pins 502 of the power supply 5 are fittingly engaged into the hollow conductive pins 301 of the end cap 3. Upon inserting the metal pin 502 into the hollow conductive pin 301, a punching action is provided against the hollow conductive pin 31 using an external punching tool to create a slight amount of shape deformation of the hollow conductive pin 301, thereby securing and fixing the metal pin 502 of the power supply 5. Upon being energized or powered on, the electrical current passes through the hollow conductive pin 301, the metal pin 502, the male plug 501, and the female plug 201, to reach the LED light bar 2, and through the LED light bar 2 to reach the LED light sources 202. In other embodiments, the male plug 501 and the female plug 502 connection structure may not be employed, and conventional wire bonding techniques can be adopted for replacement.

Referring to FIGS. 4-5 and FIGS. 7-9, the end cap 3 is sleeved over the light tube 1. To be more specific, the end cap 3 is sleeved over the rear end region 101 and extending toward the transition region 103 so as to be partially overlapping with the transition region 103. In one embodiment, the thermal conductive ring 303 of the end cap 3 is extended to reach the transition region 103 of the light tube 1, an end of the insulating tubular part 302 facing the light tube 1 is not extended to reach the transition region 103, such that the end of the insulating tubular part 302 facing the light tube 1 and the transition region 103 has a gap therebetween. In addition, the insulating tubular part 302 may be made of a material that is not a good electrical conductor, but is not limited to being plastic or ceramic materials.

In one embodiment, the hot melt adhesive 6 (which may include a commonly known material such as so-called "weld mud powder") includes phenolic resin 2127, shellac, rosin, calcium carbonate powder, zinc oxide, and ethanol, etc. The light tube 1 at the rear end region 101 and the transition region 103 (as shown in FIG. 7) is coated by the hot melt adhesive, which when undergone heating, would be greatly expanded, so as to allow tighter and closer contact between the end cap 3 and the light tube 1, thus allowing for realization of manufacturing automation for LED tube light. Furthermore, the hot melt adhesive 6 would not be likely to cause decreased reliability when operating under elevated temperature conditions by the power supply and other heat generating components. In addition, the hot melt adhesive 6 can prevent the deterioration of bond strength over time between the light tube 1 and the end cap 3, thereby improving long term reliability. Specifically, the hot melt adhesive 6 is filled in between an inner surface portion of the extending portion of the thermal conductive ring 303 and the outer peripheral surface of the light tube 1 at the rear end region 101 and the transition region 103 (location is shown in a broken/dashed line identified as "B" in FIG. 7, also referred to as "a first location"). The coating thickness of the hot melt adhesive 6 can be, for example, 0.2 mm to 0.5 mm. After curing, the hot melt adhesive 6 expands and contacts the light tube 1, thus fixing the end cap 3 to the light tube 1. Thus, upon filling and curing of the hot melt adhesive 6, the thermal conductive ring 303 is bonded or fixedly arranged to an outer (circumferential) surface of the light tube 1 by the hot melt adhesive 6 therebetween at the dashed line B in FIG. 7, which can also be referred to as the first location herein. The difference in height between the outer surface of the rear end region 101 and the outer surface of the main region 102, may thus avoiding overflow or spillover of the hot melt adhesive 6 to the main region 102 of the light tube 1, forsaking or avoiding having to perform manual adhesive wipe off or clean off, thus improving LED tube light production efficiency. Meanwhile, likewise for the embodiment shown in FIG. 9, a magnetic metal member 9 may be fixedly arranged or disposed on an inner circumferential surface of the insulating tubular part 302, and bonded to an outer peripheral surface of the light tube 1 using the hot melt adhesive 6, in which the hot melt adhesive 6 does not spillover through the gap between the end cap and one of the transition regions 103 during the filling process of the hot melt adhesive 6. During fabrication process of the LED tube light, a thermal generating equipment is used to heat up the thermal conductive ring 303, and also heat up the hot melt adhesive 6, to thereby melt and expand thereof to securely attach and bond the end cap 3 to the light tube 1.

In one embodiment, the insulating tubular part 302 of the end cap 3 includes a first tubular part 302a and a second tubular part 302b. The first tubular part 302a and the second tubular part 302b are connected along an axis of extension of the insulating tubular part 302 or an axial direction of the light tube 1. The outer diameter of the second tubular part 302b is less than the outer diameter of the first tubular part 302a. The outer diameter difference between the first tubular part 302a and the second tubular part 302b is between 0.15 mm to 0.30 mm. The thermal conductive ring 303 is fixedly configured over and surrounding the outer circumferential surface of the second tubular part 302b. The outer surface of the thermal conductive ring 303 is coplanar or substantially flush with respect to the outer circumferential surface of the first tubular part 302a, in other words, the thermal conductive ring 303 and the first tubular part 302a have substantially uniform exterior diameters from end to end. As a result, the end cap 3 achieves an outer appearance of smooth and substantially uniform tubular structure. In certain embodiments, ratio of the length of the thermal conductive ring 303 along the axial direction of the end cap 3 with respect to the axial length of the insulating tubular part 302 is from 1:2.5 to 1:5. In one embodiment, the inner surface of the second tubular part 302b and the inner surface of the thermal conductive ring 303, the outer surface of the rear end region 101 and the outer surface of the transition region 103 together form an accommodation space. In order to ensure bonding longevity using the hot melt adhesive, in the present embodiment, the second tubular part 302b is at least partially disposed around the light tube 1, the hot melt adhesive 6 is at least partially filled in an overlapped region (shown by a broken/dashed line identified as "A" in FIG. 7, also referred herein as "a second location") between the inner surface of the second tubular part 302b and the outer surface of the rear end region 101 of the light tube 1, in which the second tubular part 302b and the rear end region 101 of the light tube 1 are bonded by the hot melt adhesive 6 disposed therebetween. During manufacturing of the LED tube light, when the hot melt adhesive 6 is coated and applied between the thermal conductive ring 303 and the rear end region 101, it may be appropriate to increase the amount of hot melt adhesive used, such that in the subsequent heating process, the hot melt adhesive can be caused to expand and flow in between the second tubular part 302b and the rear end region 101, to thereby adhesively bond the second tubular part 302b and the rear end region 101. However, in the present embodiment, the hot melt adhesive 6 does not need to completely fill the entire accommodation space (as shown in the illustrated embodiment of FIG. 7), in which a gap is reserved or formed between the thermal conductive ring 303 and the second tubular part 302b. Thus, the hot melt adhesive 6 can be only partially fill the accommodation space.

During fabrication of the LED tube light, the rear end region 101 of the light tube 1 is inserted into one end of the end cap 3, the axial length of the portion of the rear end region 101 of the light tube 1 which had been inserted into the end cap 3 accounts for one-third (⅓) to two-thirds (⅔) of the total length of the thermal conductive ring 303 in an axial direction thereof. One benefit is that, the hollow conductive pins 301 and the thermal conductive ring 303 have sufficient creepage distance therebetween, and thus is not easy to form a short circuit leading to dangerous electric shock to individuals. On the other hand, due to the insulating effect of the insulating tubular part 302, thus the creepage distance between the hollow conductive pin 301 and the thermal conductive ring 303 is increased, and thus more people are likely to obtain electric shock caused by operating and testing under high voltage conditions. In this embodiment, the insulating tube 302 in general state, is not a good conductor of electricity and/or is not used for conducting purposes, but is not limited to the use made of plastics, ceramics and other materials. Furthermore, for the hot melt adhesive 6 disposed in the inner surface of the second tubular part 302b, due to presence of the second tubular part 302b interposed between the hot melt adhesive 6 and the thermal conductive ring 303, therefore the heat conducted from the thermal conductive ring 303 to the hot melt adhesive 6 may be reduced. Thus, referring to FIG. 5, in this another embodiment, the end of the second tubular part 302b facing the light tube 1 (i.e., away from the first tubular part 302a) is provided a plurality of notches 302c, configured for increasing the contact area of the thermal conductive ring 303 and the hot melt adhesive 6, in order to be more conducive to provide rapid heat conduction from the thermal conductive ring 303 to the hot melt adhesive 6, so as to accelerate the curing of the hot melt adhesive 6. The notches 302c are spatially arranged along a circumferential direction of the second tubular part 302b. Meanwhile, when the user touches the thermal conductive ring 303, due to the insulation property of the hot melt adhesive 6 located between the thermal conductive ring 303 and the light tube 1, no electrical shock would likely be produced by touching damaged portion of the light tube 1.

Figure 8:
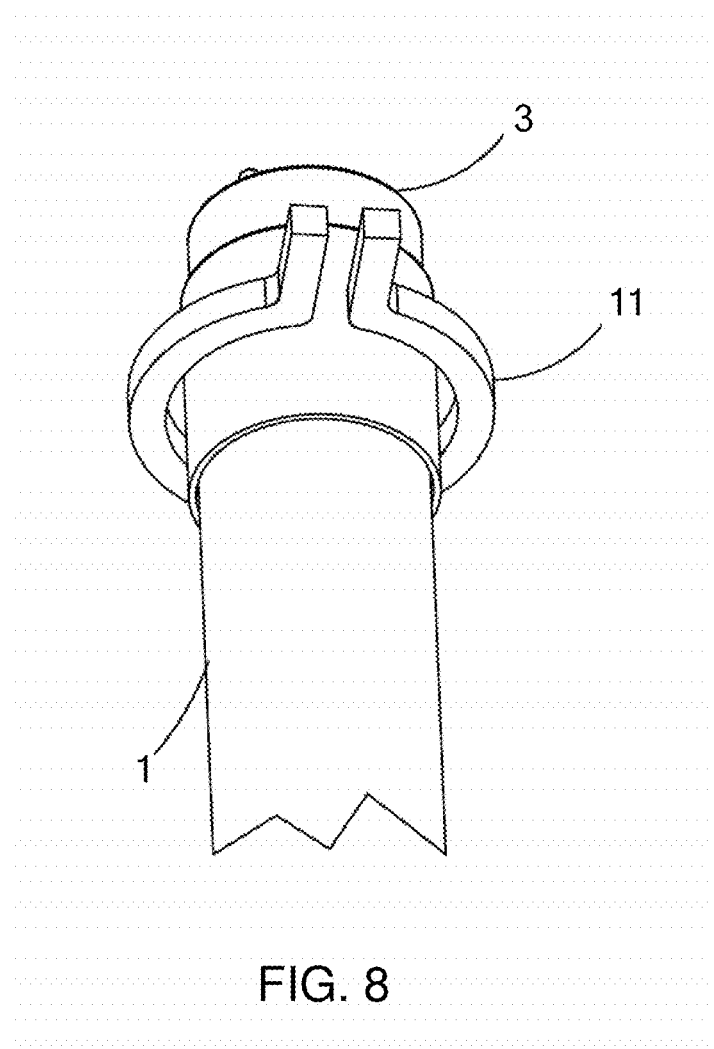
FIG. 8 is perspective illustrative schematic partial view of an all-plastic end cap and the light tube being bonded together by an induction coil heat curing process according to another embodiment of the present invention.

The thermal conductive ring 303 can be made of various heat conducting materials, the thermal conductive ring 303 of the present embodiment is a metal sheet, such as aluminum alloy. The thermal conductive ring 303 being tubular or ring shaped is sleeved over the second tubular part 302b. The insulating tubular part 302 may be made of insulating material, but would have low thermal conductivity so as to prevent the heat conduction from reaching the power supply components located inside the end cap 3, which then negatively affect performance of the power supply components. In this embodiment, the insulating tubular part 302 is a plastic tube. In other embodiments, the thermal conductive ring 303 may also be formed by a plurality of metal plates arranged along a plurality of second tubular part 302b in either a circumferentially-spaced or a not circumferentially-spaced arrangement. In other embodiments, the end cap may take on or have other structures. Referring to FIGS. 8-9, the end cap 3 according to another embodiment includes a magnetic object being a metal member 9 and an insulating tubular part 302, but not a thermal conductive ring. The magnetic metal member 9 is fixedly arranged on the inner circumferential surface of the insulating tubular part 302, and has overlapping portions with respect to the light tube 1 in the radial direction. The hot melt adhesive 6 is coated on the inner surface of the magnetic metal member 9 (the surface of the magnetic metal tube member 9 facing the light tube 1), and bonded with the outer peripheral surface of the light tube 1. In order to increase the adhesion area, and to improve the stability of the adhesion, the hot melt adhesive 6 can cover the entire inner surface of the magnetic metal member 9. When manufacturing the LED tube light in one embodiment, the insulating tubular part 302 is inserted in an induction coil 11, so that the induction coil 11 and the magnetic metal member 9 are disposed opposite (or adjacent) to one another along the radial extending direction of the insulating tubular part 302. A method for bonding the end cap 3 and the light tube 1 with the magnetic metal member 9 according to another embodiment includes the following steps. The induction coil 11 is energized. After the induction coil 11 is energized, the induction coil 11 forms an electromagnetic field, and the electromagnetic field upon contacting the magnetic metal member 9 then transform into an electrical current, so that the magnetic metal member 9 becomes heated. Then, the heat from the magnetic metal member 9 is transferred to the hot melt adhesive 6, thus curing the hot melt adhesive 6 so as to bond the end cap 3 with the light tube 1. The induction coil 11 and the insulating tubular part 302 are coaxially aligned, so that the energy transfer is more uniform. In this embodiment, a deviation value between the axes of the induction coil 11 and the insulating tubular part 302 is not more than 0.05 mm. When the bonding process is complete, the induction coil 11 is removed away from the light tube 1. The insulating tubular part 302 is further divide into two portions, namely a first tubular part 302*d* and a second tubular part 302*e*. In order to provide better support of the magnetic metal member 9, an inner diameter of the first tubular part 302*d* at the inner circumferential surface of the insulating tubular part 302, for supporting the magnetic metal member 9, is larger than the inside diameter of the second tubular part 302*e*, and a stepped structure is formed by the insulating tubular part 302 and the second tubular part 302*e*, where an end of the magnetic metal member 9 as viewed in an axial direction is abutted against the stepped structure. An inside diameter of the magnetic metal member 9 is larger than an outer diameter of the end (which is the rear end region 101) of the light tube 2. Upon installation of the magnetic metal member 9, the entire inner surface of the end cap 3 is maintained flush. Additionally, the magnetic metal member 9 may be of various shapes, e.g., a sheet-like or tubular-like structure being circumferentially arranged or the like, where the magnetic metal member 9 is coaxially arranged with the insulating tubular part 302. In other embodiments, the manufacturing process for bonding the end cap 3 and the light tube 1 can be achieved without the magnetic metal member 9. For example, a magnetic object such as iron power, nickel power or iron-nickel power may be directly doped into the hot melt adhesive 6. When manufacturing the LED tube light 1 of this embodiment, the hot melt adhesive 6 is filled between the inner circumferential surface of the insulating tubular part 32 of the end cap 3 and the end of the light tube 1. After the induction coil 11 is energized, the induction coil 11 forms an electromagnetic field, and the charged particles of the magnetic object become heated. Then, the heat generated from the charged particles of the magnetic object is transferred to the hot melt adhesive 6, thus curing the hot melt adhesive 6 so as to bond the end cap 3 with the light tube 1.

In other embodiments, the end cap 3 can also be made of all-metal, which may then use an insulating member beneath the hollow conductive pins as safety feature for accommodating high voltage usage.

Figure 16:
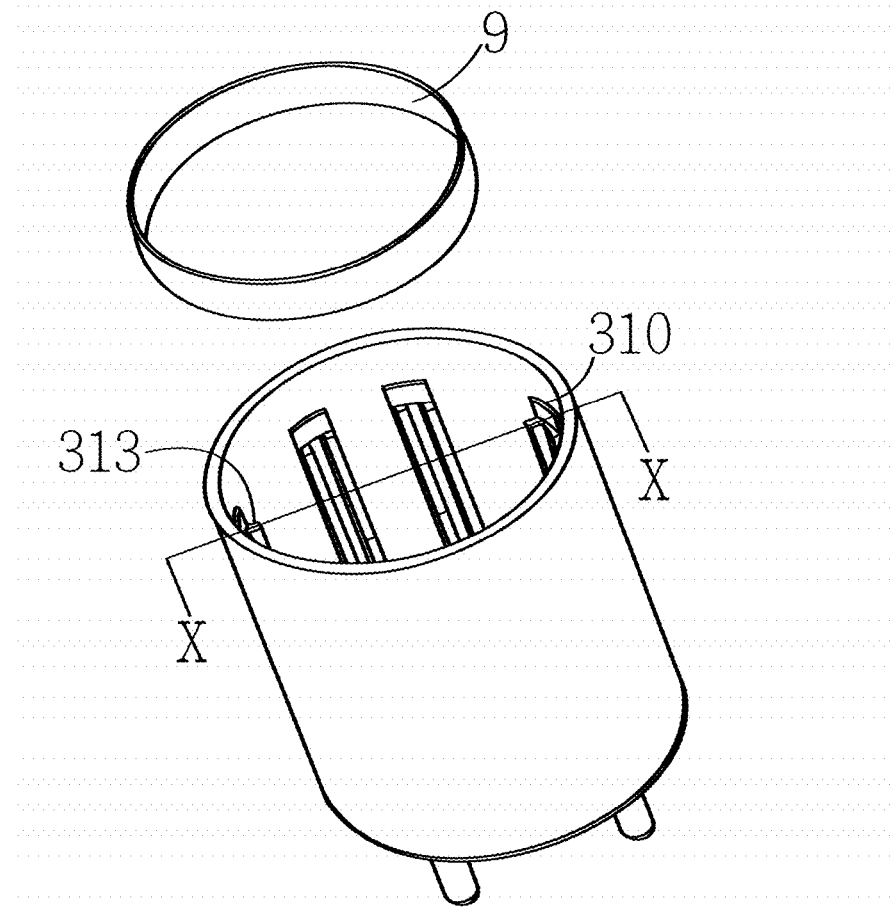
FIG. 16 is an exploded partial perspective view of the insulating tubular part of the end cap according to another embodiment of the present invention, showing a supporting portion and a protruding portion disposed on the inner surface thereof.
Figure 17:
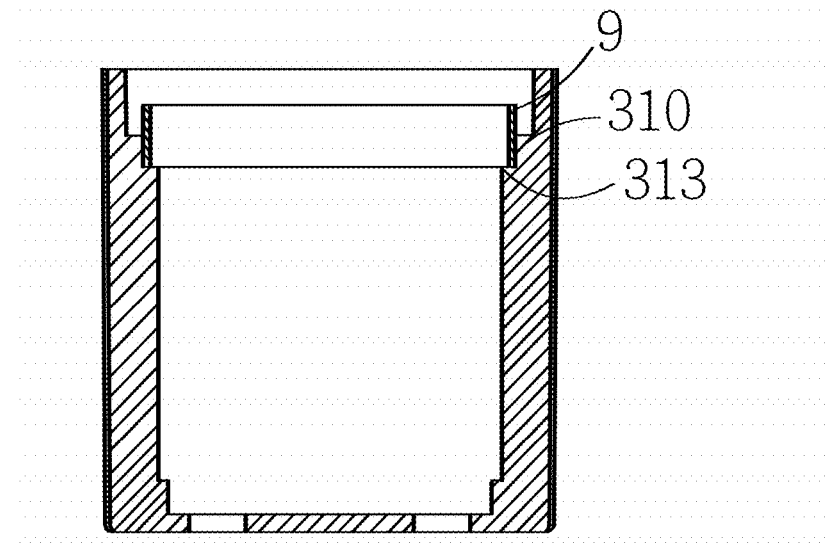
FIG. 17 is a cross-sectional view of the insulating tubular part and the magnetic metal member of the end cap of FIG. 16 taken along a line X-X.
Figure 18:
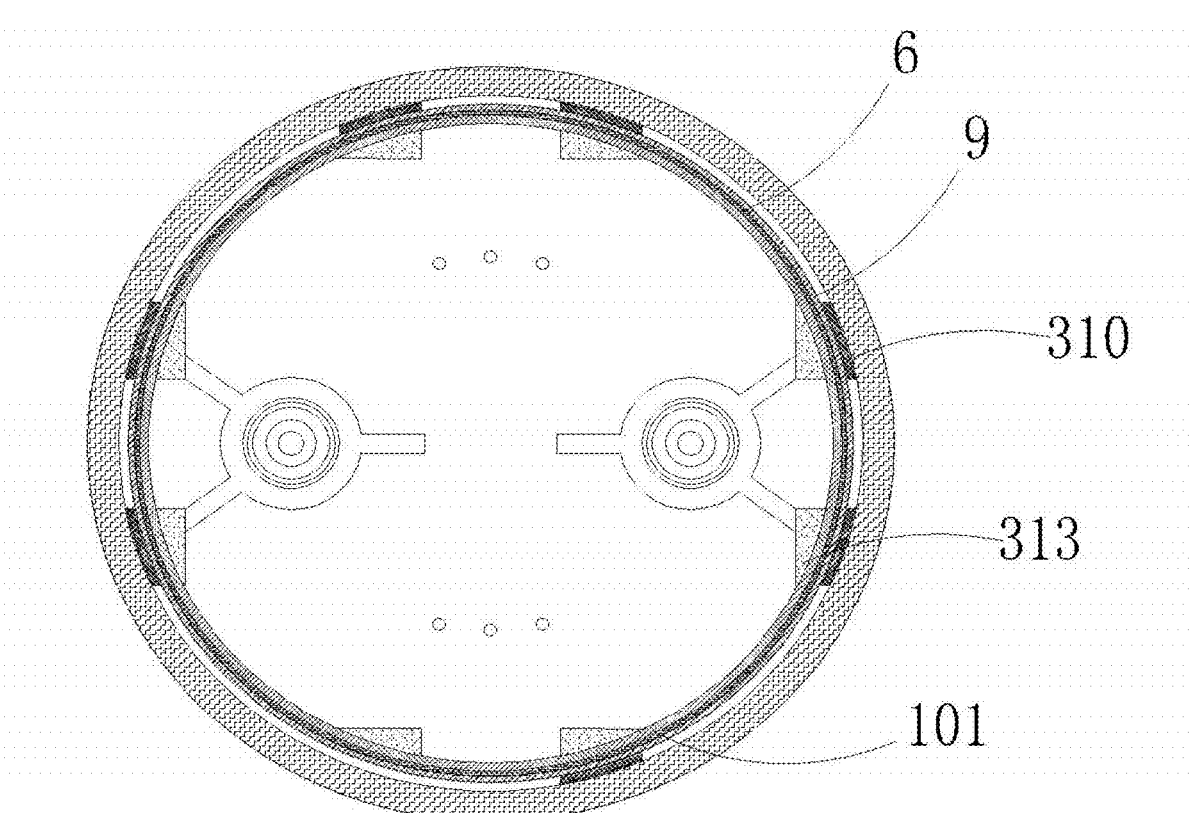
FIG. 18 is a top sectional view of the end cap shown in FIG. 16, showing the insulating tubular part and the light tube extending along a radial axis of the light tube.
Figure 19:
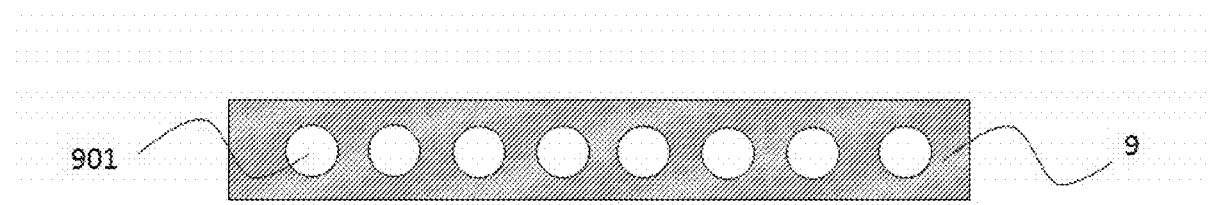
FIG. 19 is a schematic diagram showing the structure of the magnetic metal member including at least one hole, upon flattening out the magnetic metal member to be extending in a horizontal plane.
Figure 20:
FIG. 20 is a schematic diagram showing the structure of the magnetic metal member including at least one embossed structure, upon flattening out the magnetic metal member to be extending in a horizontal plane.
Figure 21:
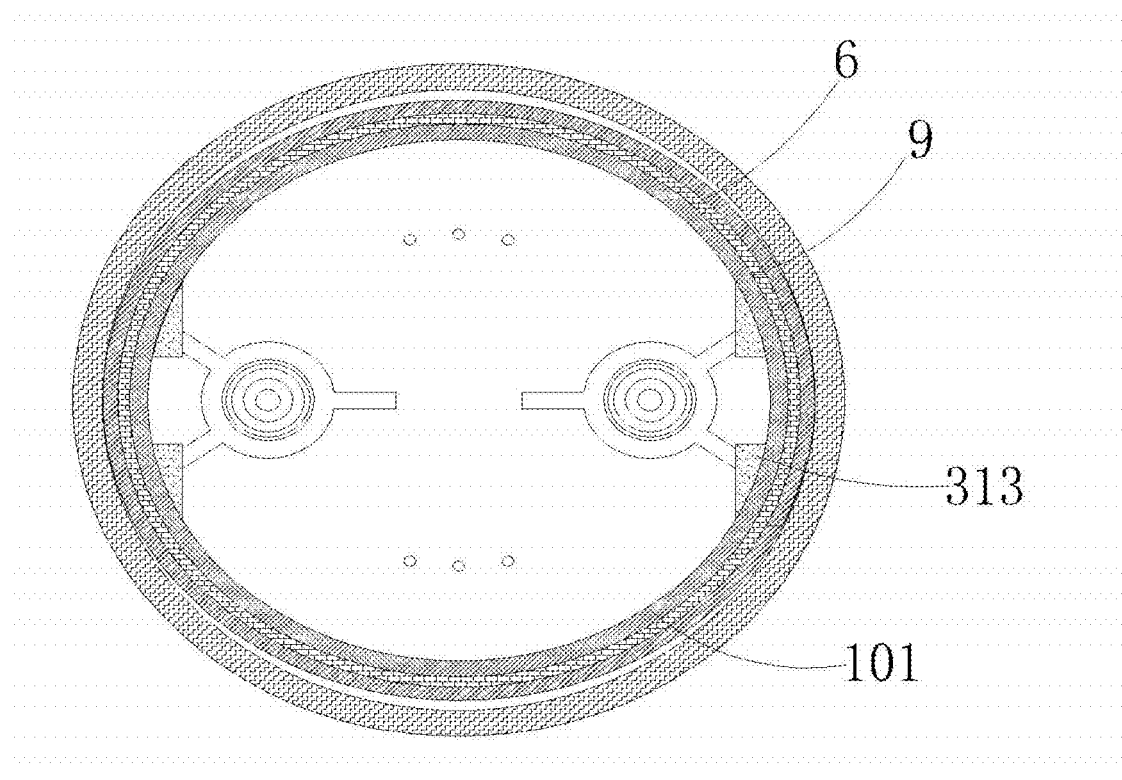
FIG. 21 is a top cross-sectional view of another embodiment of the end cap, showing an insulating tubular part in an elliptical or oval shape extending along a radial axis of the light tube which also has a corresponding elliptical or oval shape.

In other embodiments, the magnetic metal member 9 can have at least one opening 901 as shown in FIG. 19, in which the openings 901 can be circular, but are not limited to being circular in shape, such as, for example, oval, square, star shaped, etc., as long they may reduce the contact area between the magnetic metal member 9 and the inner peripheral surface of the insulating tubular part 302, while maintaining the function of melting and curing the hot melt adhesive 6. Preferably, the openings 901 occupy 10% to 50% of the area of the magnetic metal member 9. The opening 901 can be arranged circumferentially around the magnetic metal member 9 in an equidistantly spaced or not equally spaced manner. In other embodiments, the magnetic metal member 9 has an indentation/embossed structure 903 as shown in FIG. 20, in which the embossed structure 903 is formed to be protruding from the inner surface of the magnetic metal member 9 toward the outer surface of the magnetic metal member 9, or vice versa, so long as the contact area between the inner peripheral surface of the insulating tubular part 302 and the outer surface of the magnetic metal member 9 is reduced, but can sustain the function of melting and curing the hot melt adhesive 6. In other embodiments, the magnetic metal member 9 is a non-circular ring, such as, but not limited to an oval ring as shown in FIG. 21. When the light tube 1 and the end cap 3 are both circular, the minor axis of the oval ring shape is slightly larger than the outer diameter of the end region of the light tube 1, so long as the contact area of the inner peripheral surface of the insulating tubular part 302 and the outer surface of the magnetic metal member 9 is reduced, but can achieve or maintain the function of melting and curing the hot melt adhesive 6. When the light tube 1 and the end cap 3 is circular, non-circular rings can reduce the contact area between the magnetic metal member 9 and the inner peripheral surface of the insulating tubular part, but still can maintain the function of melting and curing hot melt adhesive 6. In some embodiments, the inner surface of the insulating tubular part 302 includes a supporting portion 313, which supports the (non-circular shaped) magnetic metal member 9, so that the contact area between the magnetic metal member 9 and the inner surface of the insulating tubular part 302 is reduced, but still achieves the melting and curing of the hot melt adhesive 6. In other embodiments, the inner circumferential surface of the insulating tubular part 302 has a plurality of supporting portions 313 and a plurality of protruding portions 310, as shown in FIGS. 16-18, in which the thickness of the protruding portion 310 is smaller than the thickness of the supporting portion 313. A stepped structure is formed at an upper edge of the supporting portion 313, in which the magnetic metal member 9 is abutted against the upper edges of the supporting portions 313, so that the magnetic metal member 9 can be then securely or firmly mounted within the insulating tubular part 302. At least a portion of the protruding portion 310 is positioned between the inner peripheral surface of the insulating tubular part 302 and the magnetic metal member 9. The arrangement of the protruding portions 310 may be in the circumferential direction of the insulating tubular part 302 at equidistantly spaced or non-equidistantly spaced distances, the contact area of the inner peripheral surface of the insulating tubular part 302 and the outer surface of the magnetic metal member 9 is reduced, but can achieve or maintain the function of melting and curing the hot melt adhesive 6. In some embodiments, the protruding thickness of the supporting portion 313 toward the interior of the insulating tubular part 302 is between 1 mm to 2 mm. In some embodiments, the thickness of the protruding portion 310 of the insulating tubular part 302 that is disposed on the inner surface of the magnetic metal member 9 is less than the thickness of the supporting portion 313, and the thickness of the protruding portion 310 is between 0.2 mm to 1 mm.

Figure 10:
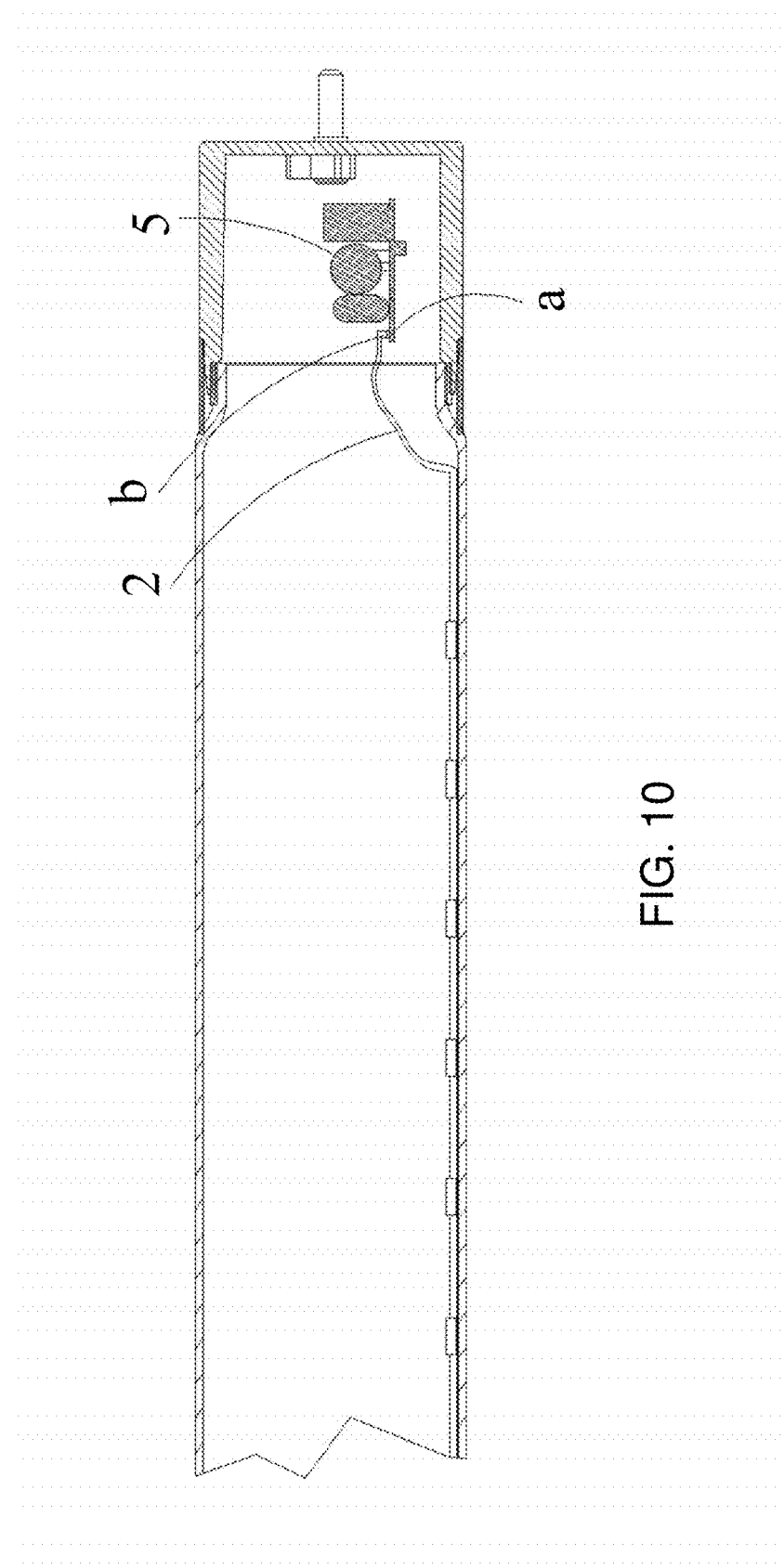
FIG. 10 is a sectional partial view of the connecting region of the light tube showing a connecting structure between the LED light bar and the power supply.
Figure 15:
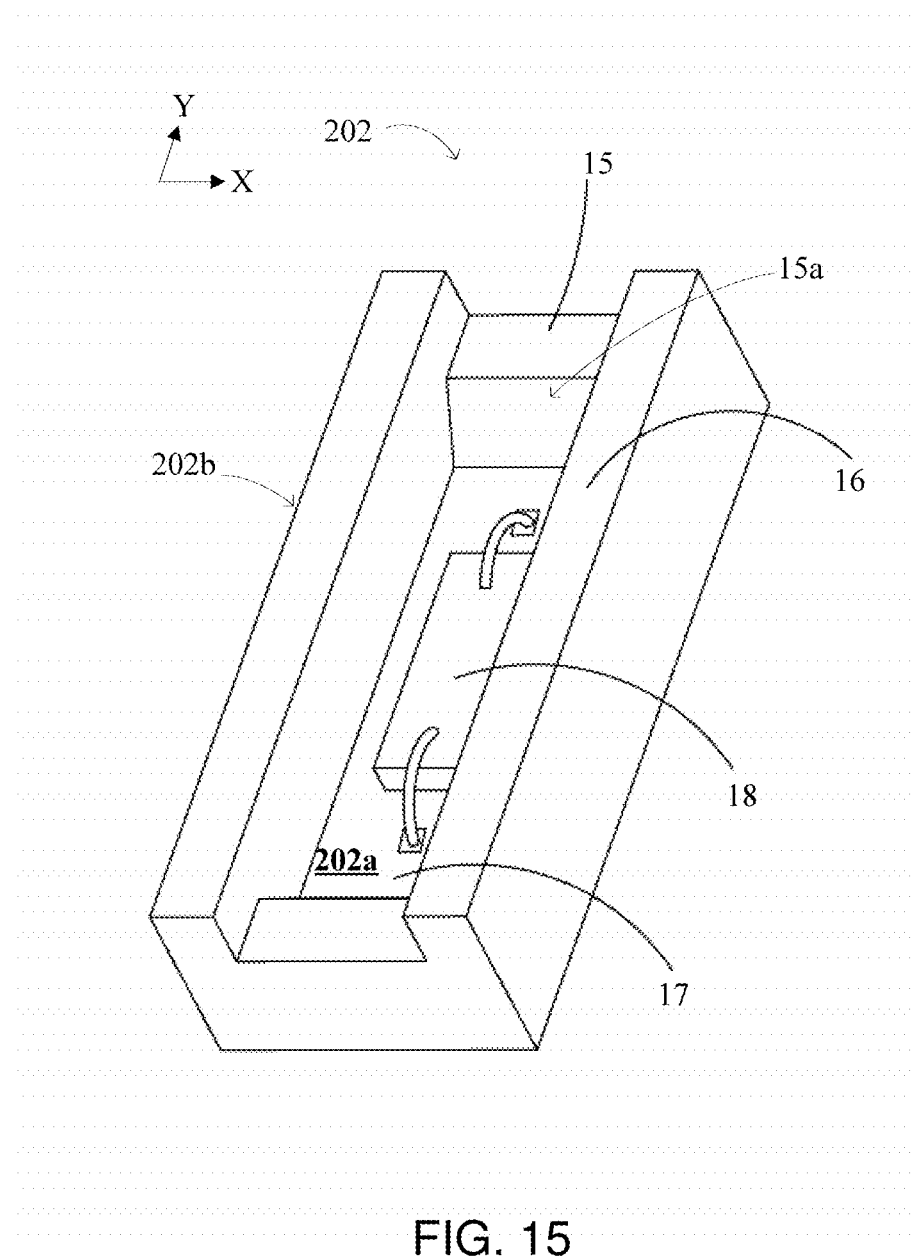
FIG. 15 is a perspective view of an LED lead frame for the LED light sources of the LED tube light of one embodiment of the present invention.

Referring again to FIG. 2, the LED tube light according to one embodiment of present invention also includes an adhesive 4, an insulation adhesive 7, and an optical adhesive 8. The LED light bar 2 is bonded onto the inner circumferential surface of the light tube 1 by using the adhesive 4. In the illustrated embodiment, the adhesive 4 may be silicone adhesive, but is not limited thereto. The insulation adhesive 7 is coated on the surface of the LED light bar 2 facing the LED light sources 202, so that the LED light bar 2 is not exposed, thus insulating the LED light bar 2 and the outside environment. During application of the adhesive, a plurality of through holes 701 are reserved and set aside corresponding to the positions/locations of the LED light sources 202. The LED light sources 202 are mounted in the through holes 701. The material composition of the insulation adhesive 7 comprises, for example, vinyl silicone, hydrogen polysiloxane and aluminum oxide. The insulation adhesive 7 has a thickness range, for example, of 100 µm to 140 µm (microns). If less than 100 µm in thickness, the insulation adhesive 7 may not achieve sufficient insulating effect, but if more than 140 µm in thickness, the excessive insulation adhesive will likely result in material waste. An optical adhesive 8 is applied or coated on the surface of the LED light source 202. The optical adhesive 8 is a clear or transparent material, in order to ensure optimal light transmission rate. After providing coating application to the LED light sources 202, the shape or structure of the optical adhesive 8 may be in the form of a particulate gel or granular, a strip or a sheet. A preferred range for the refractive index of the optical adhesive 8 is between 1.22 and 1.6. Another embodiment of the optical adhesive 8 can have a refractive index value that is equal to a square root of the refractive index of the housing or casing of the LED light source 202, or equal to plus or minus 15% of the square root of the refractive index of the housing or casing of the LED light source 202, so as to achieve better light transmittance. The housing/casing of the LED light sources 202 is a housing structure to accommodate and carry the LED dies (or chips) such as a LED lead frame 202b as shown in FIG. 15. The refractive index range of the optical adhesive 8 in this embodiment is between 1.225 and 1.253. The thickness of the optical adhesive 8 can be in the range of 1.1 mm to 1.3 mm. When assembling the LED light sources to the LED light bar, the optical adhesive 8 is applied on the LED light sources 202; then the insulation adhesive 7 is coated on one side of the LED light bar 2. Then the LED light sources 202 are fixed or mounted on the LED light bar 2. The other side of the LED light bar 2 which is opposite to the side of which the LED light sources 202 are mounted thereon, is bonded and affixed using the adhesive 4 to the inner surface of the light tube 1. Later, the end cap 3 is fixed to the end portion of the light tube 1, while the LED light sources 202 and the power supply 5 are electrically connected by the LED light bar 2. Alternatively, as shown in FIG. 10, the LED light bar 2 can be used to pass through the transition region 103 for providing electrical coupling to the power supply 5, or traditional wire bonding methods can be adopted to provide the electrical coupling as well. A finished LED tube light is then fabricated upon the attachment or joining of the end caps 3 to the light tube 1 as shown in FIG. 7 (with the structures shown in FIGS. 4-5), or as shown in FIG. 8 (with the structure of FIG. 9).

In one embodiment, the LED light bar 2 is fixed by the adhesive 4 to an inner circumferential surface of the light tube 1, so that the LED light sources 202 are mounted in the inner circumferential surface of the light tube 1, which can increase the illumination angle of the LED light sources 202, thereby expanding the viewing angle, so that an excess of 330 degrees viewing angle is possible to achieve. Through the utilization of applying the insulation adhesive 7 on the LED light bar 2 and applying of the optical adhesive 8 on the LED light sources, the electrical insulation of the LED light bar 2 is provided, so that even when the light tube 1 is broken, electrical shock does not occur, thereby improving safety.

Furthermore, the LED light bar 2 may be a flexible substrate, an aluminum plate or strip, or a FR4 board, in an alternative embodiment. The light tube 1 of one embodiment is a glass tube. If the LED light bar 2 adopts rigid aluminum plate or FR4 board, when the light tube has been ruptured, e.g., broken into two parts, the entire light tube is still able to maintain a straight pipe or tube configuration, then the user may be under a false impression the LED tube light can remain usable and fully functional and it may be easy to cause electric shock upon handling or installation thereof. Because of added flexibility and bendability of the flexible substrate for the LED light bar 2, this issue faced by the aluminum plate, FR4 board, conventional 3-layered flexible board having inadequate flexibility and bendability is thereby addressed. Due to the adopting of the flexible substrate/bendable circuit board for the LED light bar 2 of the present embodiment, the LED light bar 2 allows a ruptured or broken light tube not to be able to maintain a straight pipe or tube configuration so as to better inform the user that the LED tube light is rendered unusable so as to avoid potential electric shock accidents from occurring. The following are further descriptions of the flexible substrate/bendable circuit board used as the LED light bar 2. The flexible substrate/bendable circuit board and the output terminal of the power supply 5 can be connected by wire bonding, the male plug 501 and the female plug 201, or connected by soldering joint. In one embodiment, the method for securing the LED light bar 2 is the same as described before, where one side of the flexible substrate is bonded to the inner surface of the light tube 1 by using the adhesive 4, and the two ends of the flexible substrate/bendable circuit board can be either bonded (fixed) or not bonded to the inner surface of the light tube 1. If the two ends of the flexible substrate are not bonded or fixed to the inner surface of the light tube, and also if the wire bonding is used, the bonding wires are prone to be possibly broken apart due to sporadic motions caused by subsequent transport activities as well as being free to move at the two ends of the flexible substrate/bendable circuit board. Therefore, a better option may be by soldering for forming solder joints between the flexible substrate and the power supply. Referring to FIG. 10, the LED light bar 2 in the form of the bendable circuit board can be used to pass through the transition region 103 and be solder bonded to the output terminal of the power supply 5 for providing electrical coupling to the power supply 5, so as to avoid the usage of wire bonding, and improving upon the reliability thereof. In the illustrated embodiment, the LED light bar 2 is not fixed to an inner circumferential surface of the light tube at two ends thereof. The flexible substrate does not need to have the female plug 201, and the output terminal of the power supply 5 does not need to have the male plug 501. The output terminal of the power supply 5 can have pads "a," and leaving behind an amount of tin solder on the pads "a," so that the thickness of the tin solder on the pads "a" are sufficient enough for later forming a solder joint. Likewise, the ends of the bendable circuit board can also have pads "b," so that the pads a from the output terminal of the power supply 5 are soldered to the pads "b" of the bendable circuit board. In this embodiment, the pads "b" of the bendable circuit board are two separated pads for electrically connecting with the anode and the cathode of the bendable circuit board, respectively. As shown in FIG. 10, the power supply 5 may have a circuit board having a pad "a" formed thereon, and may have circuit elements, such as power components disposed on the circuit board. Thus, as can be seen in FIG. 10 and described above, a pad "b" of the flexible substrate/bendable circuit board can be directly soldered to a pad "a" of the circuit board of the power supply, thus alleviating the need for wire bonding between the LED light bar 2 and the power supply 5. In other embodiments, for the sake of achieving scalability and compatibility, the number or quantity of the pads "b" can be more than two, for example, three, four, or more than four. When the number of pads are three, the third pad can be used for ground pad. When the number of the pads are four, the fourth pad can be used for the signal input terminal. Correspondingly, the pads "a" and the pads "b" possess the same number of bond pads. When the number of bond pads is at least three, the bond pads can be arranged in a row or two rows, in accordance with dimensions of the actual occupying area, so as to prevent the pads from being too close and causing electrical short. In other embodiments, a portion of a printed circuit of the LED light bar can be configured on the bendable printed circuit board, the pad b can be a single bond pad. The lesser the number of the bond pads, the easier the fabrication process becomes. On the other hand, for a higher number of the bond pads, the bendable circuit board and the output terminal of the power supply 5 have stronger and more secured electrical connection therebetween. In other embodiments, the inner portion of the bond pad of the pad "b" can have a plurality of through holes, the pad "a" can be soldered to the pad "b," so that upon soldering, the solder tin can penetrate through the through holes of the pad "b." Upon exiting the through holes, the solder tin can be accumulated surrounding the outer periphery of the opening of the through holes, so that upon cooling, a plurality of solder balls, with diameter larger than the diameter of the through holes, are formed. The solder balls possess a similar function as nails, so that apart from having the solder tin to secure the pad a and the pad "b," the solder balls further act to strengthen the electrical connection of the two pads "a," "b." In other embodiments, the through holes of the bond pads are disposed at the periphery, for example, the bond pad possess a notch, the pad "a" and the pad "b" are securely electrically connected via the solder tin extending and filling through the notch, and the excess solder tin would accumulate around the periphery of the openings of the through holes, so that upon cooling, the solder balls with diameter larger than the diameter of the through holes are formed. In the one embodiment, due to the notch structure of the bond pad, the solder tin has the function similar to C-shaped nails. Regardless of whether of forming the through holes of the bond pads before the solder bonding process or during the solder bonding process using the soldering tip directly, the same through holes structure of present embodiment can be formed. The soldering tip and a contacting surface of the solder tin can be a flat, concave, or convex surface, the convex surface can be a long strip shape or of a grid shape. The convex surface of the solder tin does not completely cover the through holes of the bond pads, so as to ensure that the solder tin can penetrate through the through holes. When the solder tin has accumulated around the periphery of the opening of the through holes, the concave surface can provide a receiving space for the solder ball. In other embodiments, the bendable circuit board has a tooling hole, which can be used to ensure precise positioning of the pad "a" with respect to the pad "b" during solder bonding. In the above embodiment, most of the bendable circuit board is attached and secured to the inner surface of the light tube 1. However, the two ends of the bendable circuit board are not secured or fixed to the inner surface of the light tube 1, which thereby form a freely extending end portion, respectively. Upon assembling of the LED tube light, the freely extending end portion along with the soldered connection between the output terminal of the power supply and itself would be coiled, curled up or deformed to be fittingly accommodating inside the light tube 1, so that the freely extending end portions of the bendable circuit board are deformed in shape due to being contracted or curled to fit or accommodate inside the light tube 1. Using the abovementioned bendable circuit board having the bond pad with through holes, the pad "a" of the power supply share the same surface with one of the surfaces of the bendable circuit board that is mounted with the LED light source. When the freely extending end portions of the bendable circuit board are deformed due to contraction or curling up, a lateral tension is exerted on the power supply at the connection end of the power supply and the bendable circuit board. In contrast to the solder bonding technique of having the pad "a" of the power supply being of different surface to one of the surfaces of the bendable circuit board that is mounted with the LED light source thereon, a downward tension is exerted on the power supply at the connection end of the power supply and the bendable circuit board, so that the bendable circuit board, with the through-hole configured bond pad, form a stronger and more secure electrical connection between the bendable circuit board and the power supply. If the two ends of the bendable circuit board are to be securely fixed to the inner surface of the light tube 1, the female plug 201 is mounted on the bendable circuit board, and the male plug 501 of the power supply 5 is inserted into the female plug 201, in that order, so as to establish electrical connection therebetween. Direct current (DC) signals are carried on the conductive layer 2a of the bendable circuit board, unlike the 3-layered conventional flexible substrates for carrying high frequency signals using a dielectric layer. One of the advantages of using the bendable circuit board as shown in illustrated embodiment of FIG. 10 over conventional rigid LED light bars is that damage or breakages occurring during the wire bonding of the LED light bar and the power supply through the narrowed curved region of the light tube (for a conventional rigid LED light bar) are prevented by solder bonding of the bendable circuit board and then coiling the bendable circuit board back into the light tube to arrive at proper position inside the light tube.

Figure 11:
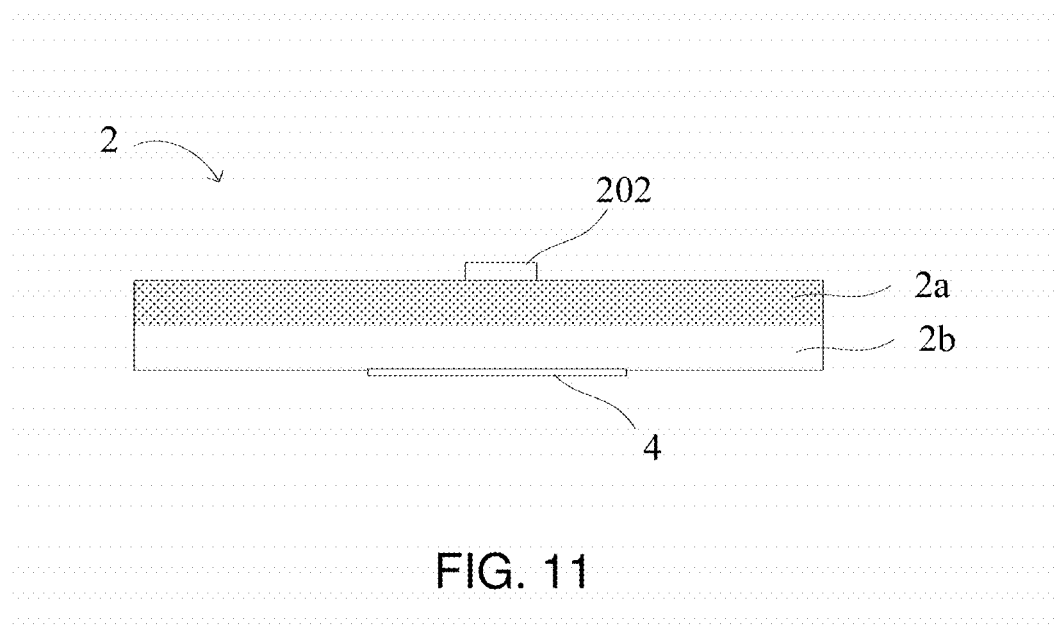
FIG. 11 is a cross-sectional view of a bi-layered flexible substrate of the LED tube light of an embodiment of the present invention.

Referring to the illustrated embodiment of FIG. 11, the LED light bar 2 is a bendable circuit board which includes a conductive layer 2a and a dielectric layer 2b that are stackingly arranged. The LED light source 202 is disposed on a surface of the conductive layer 2a away from the dielectric layer 2b. For example, the dielectric layer 2b is disposed on the conductive layer 2a away from the LED light sources 202. The conductive layer 2a is electrically connected to the power supply 5. Meanwhile, the adhesive 4 is disposed on a surface of the dielectric layer 2b away from the conductive layer 2a to bond and to fix the dielectric layer 2b to the inner circumferential surface of the light tube 1. The conductive layer 2a can be a metal layer serving as a power supply layer, or can be bonding wires such as copper wire. In an alternative embodiment, the LED light bar 2 further includes a circuit protection layer (not shown). In another alternative embodiment, the dielectric layer can be omitted, in which the conductive layer is directly bonded to the inner circumferential surface of the light tube. The circuit protection layer can be an ink material, possessing functions as solder resist and optical reflectance. Whether the conductive layer 2a is of one-layered, or two-layered structure, the circuit protective layer can be adopted. The circuit protection layer can be disposed on the side/surface of the LED light bar 2, such as the same surface of the conductive layer which has the LED light source 202 disposed thereon. It should be noted that, in the present embodiment, the bendable circuit board is a one-layered structure made of just one layer of the conductive layer 2a, or a two-layered structure (made of one layer of the conductive layer 2a and one layer of the dielectric layer 2b), and thus would be more bendable or flexible to curl than the conventional three-layered flexible substrate. As a result, the bendable circuit board (the LED light bar 2) of the present embodiment can be installed in other light tube that is of a customized shape or non-linear shape, and the bendable circuit board can be mounted touching the sidewall of the light tube. The bendable circuit board mounted closely to the tube wall is one desirable configuration, and the fewer number of layers thereof, the better the heat dissipation effect, and the lower the material cost. Of course, the bendable circuit board is not limited to being one-layered or two-layered structure only, and in another embodiment, the bendable circuit board can include multiple layers of the conductive layers 2a and multiple layers of the dielectric layers 2b, in which the dielectric layers 2b and the conductive layers 2a are sequentially stacked in a staggered manner, respectively, to be disposed on the surface of the one conductive layer 2a that is opposite from the surface of the one conductive layer 2a which has the LED light source 202 disposed thereon. The LED light source 202 is disposed on the uppermost layer of the conductive layers 2a, and is electrically connected to the power supply 5 through the (uppermost) conductive layer 2a. Furthermore, the inner peripheral surface of the light tube 1 or the outer circumferential surface thereof is covered with an adhesive film (not shown), for the sake of isolating the inner content from outside content of the light tube 1 after the light tube 1 has been ruptured. The present embodiment has the adhesive film coated on the inner peripheral surface of the light tube 1.

In an example embodiment, the light tube 1 can be a glass tube with a coated adhesive film on the inner wall thereof (not shown). The coated adhesive film also serves to isolate and segregate the inside and the outside contents of the light tube 1 upon being ruptured thereof. The coated adhesive film material includes methyl vinyl silicone oil, hydro silicone oil, Xylene, and calcium carbonate. The methyl vinyl silicone oil chemical formula is $(C_2H_8OSi)n.C_2H_3$. The hydrosilicon oil chemical formula is: $C_3H_9OSi.(CH_4OSi)$ $n.C_3H_9Si$; and the product produced is polydimethylsiloxane (silicone elastomer), which has chemical formula as follow:

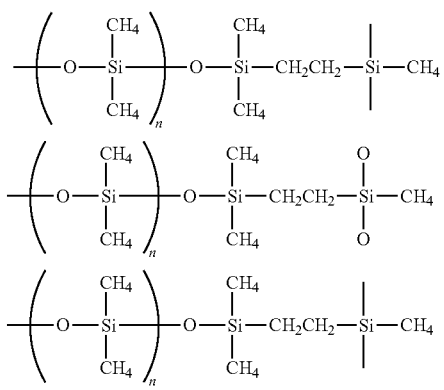

Xylene is used as an auxiliary material. Upon solidifying or hardening of the coated adhesive film when coated on the inner surface of the light tube 1, the xylene will be volatilized and removed. The xylene is mainly used for the purpose of adjusting the degree of adhesion or adhesiveness, which can then adjust the thickness of the bonding adhesive thickness. In one embodiment, the thickness of the coated adhesive film can be between 10 to 800 microns (μm), and the preferred thickness of the coated adhesive film can be between 100 to 140 microns (μm). This is because the bonding adhesive thickness being less than 100 microns does not have sufficient shatterproof capability for the glass tube, and thus the glass tube is prone to crack or shatter. An amount above 140 microns of bonding adhesive thickness would reduce the light transmittance rate, and also increase material cost. Vinyl silicone oil+hydrosilicone oil allowable ratio range is (19.8-20.2):(20.2-20.6), but if exceeding this allowable ratio range, would thereby negatively affect the adhesiveness or bonding strength. The allowable ratio range for the xylene and calcium carbonate is (2-6):(2-6), and if lesser than the lowest ratio, the light transmittance of the light tube will be increased, but grainy spots would be produced or resulted from illumination of the LED light tube, negatively affect illumination quality and effect.

If the LED light bar 2 is configured to be a flexible substrate, no coated adhesive film is thereby required.

Figure 12:
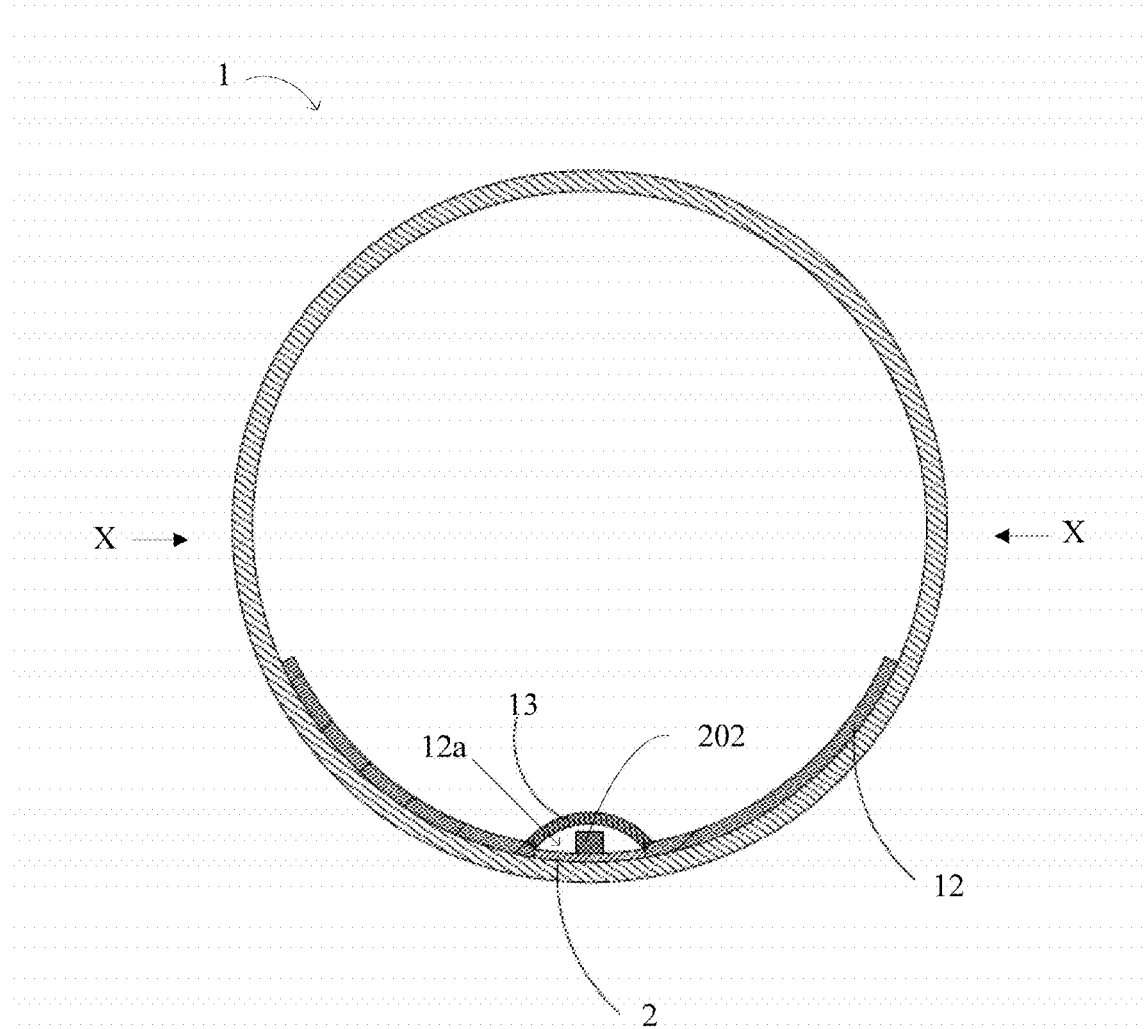
FIG. 12 is an end cross-sectional view of the light tube of the LED tube light of one embodiment of present invention as taken along axial direction thereof.

To improve the illumination efficiency of the LED tube light, the light tube 1 has been modified according to one embodiment by having a diffusion film layer 13 coated and bonded to the inner wall thereof as shown in FIG. 12, so that the light outputted or emitted from the LED light sources 202 is transmitted through the diffusion film layer 13 and then through the light tube 1. The diffusion film layer 13 allows for improved illumination distribution uniformity of the light outputted by the LED light sources 202. The diffusion film layer 13 can be coated onto different locations, such as onto the inner wall or outer wall of the light tube 1 or onto the diffusion coating layer (not shown) at the surface of each LED light source 202, or coated onto a separate membrane cover covering the LED light source 202. The diffusion film layer 13 in the illustrated embodiment of FIG. 12 is a diffusion film that is not in contact with the LED light source 202 (but covers above or over to enclose the LED light sources underneath thereof). The diffusion film layer 13 can be an optical diffusion film or sheet, usually made of polystyrene (PS), polymethyl methacrylate (PMMA), polyethylene terephthalate (PET), and/or polycarbonate (PET), in one composite material composition thereof. In alternative embodiment, the diffusion film layer can be an optical diffusion coating, which has a material composition to include at least one of calcium carbonate, halogen calcium phosphate and aluminum hydroxide that possesses excellent light diffusion and transmittance to exceed 90%. Further, the applying of the diffusion film layer made of optical diffusion coating material to an outer surface of the rear end region 101 along with the hot melt adhesive 6 would produce or generate increased friction resistance between the end cap and the light tube due to the presence of the optical diffusion coating (when compared to that of an example that is without any optical diffusion coating), which is beneficial for preventing accidental detachment of the end cap from the light tube. Composition of the diffusion film layer made by the optical diffusion coating for the alternative embodiment includes calcium carbonate (e.g., CMS-5000, white powder), thickening agents (e.g., thickeners DV-961, milky white liquid), and a ceramic activated carbon (e.g., ceramic activated carbon SW-C, which is a colorless liquid). Wherein, the chemical name for the thickener DV-961 is colloidal silica modified acrylic acid resin used for enhancing calcium carbonate to be adhered to the inner surface of the glass light tube 1, whose components include acrylic acid resins, silicone and deionized water; ceramic activated carbon SW-C components include Sodium Di(2-ethylhexyl) Sulfosuccinate, isopropanol and deionized water, wherein the Sodium Di(2-ethylhexyl) Sulfosuccinate has the chemical formula as follow:

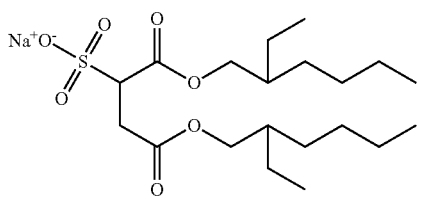

Specifically, average thickness of the diffusion film layer or the optical diffusion coating falls between 20~30 μm after being coated on the inner circumferential surface of the glass tube, where finally the deionized water will be evaporated, leaving behind the calcium carbonate, ceramic activated carbon and the thickener. Using this optical diffusion coating material for forming the diffusion film layer 13, a light transmittance of about 90% can be achieved. In addition, this diffusion film layer 13 can also provide electrical isolation for reducing risk of electric shock to a user upon breakage of the light tube. Furthermore, the diffusion film layer 13 provides an improved illumination distribution uniformity of the light outputted by the LED light sources 202 so as to avoid the formation of dark regions seen inside the illuminated or lit up light tube 1. In other embodiments, the optical diffusion coating can also be made of strontium phosphate (or a mixture of calcium carbonate and strontium phosphate) along with a thickening agent, ceramic activated carbon and deionized water, and the coating thickness can be same as that of present embodiment. In another embodiment, the optical diffusion coating material may be calcium carbonate-based material with a small amount of reflective material (such as strontium phosphate or barium sulfate), the thickener, deionizes water and carbon activated ceramic to be coated onto the inner circumferential surface of the glass tube with the average thickness of the optical diffusion coating falls between 20~30 μm. Then, finally the deionized water will be evaporated, leaving behind the calcium carbonate, the reflective material, ceramic activated carbon and the thickener. In the diffusion phenomena, in microscopic terms, light is reflected by particles. The particle size of the reflective material such as strontium phosphate or barium sulfate will be much larger than the particle size of the calcium carbonate. Therefore, selecting a small amount of reflective material in the optical diffusion coating can effectively increase the diffusion effect of light. In other embodiments, halogen calcium phosphate or aluminum hydroxide can also be served as the main material for forming the diffusion film layer 13.

Figure 13:
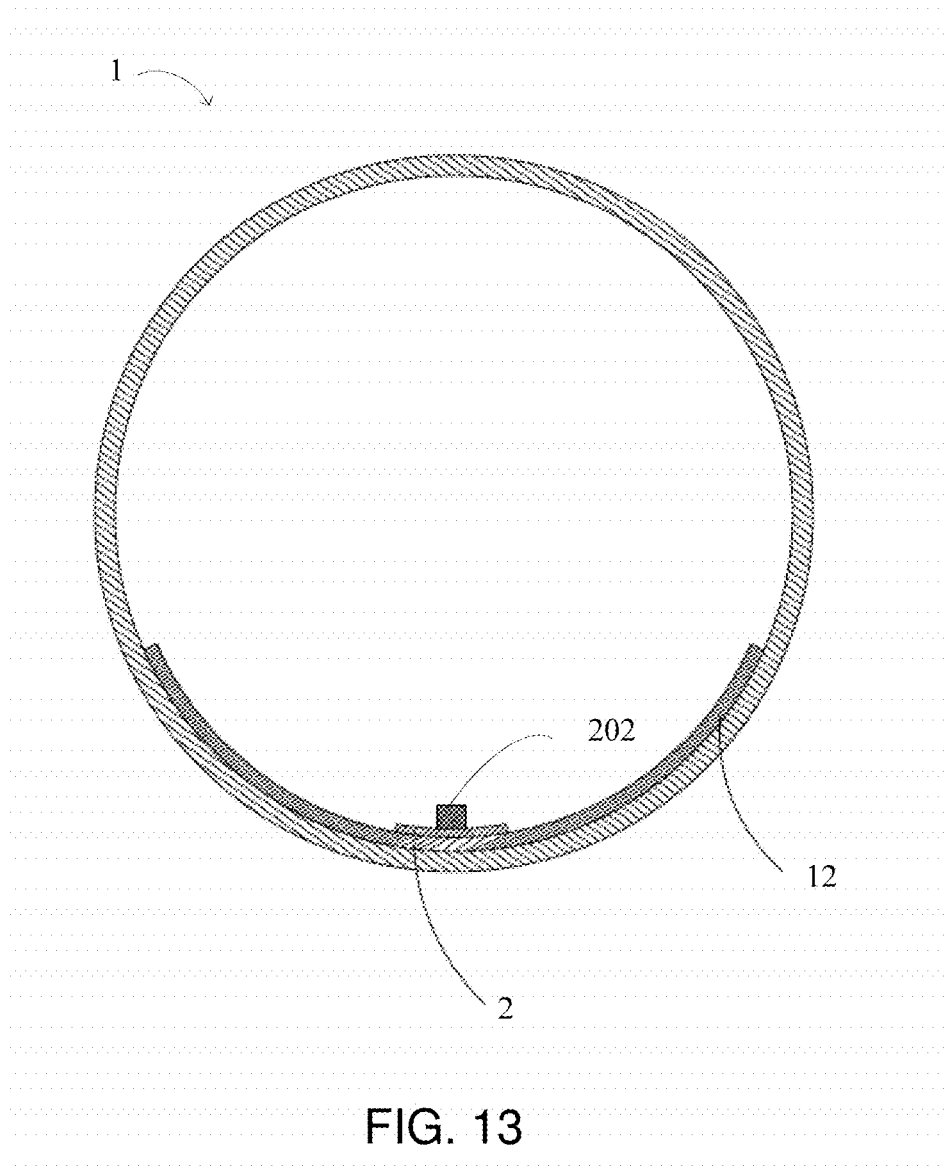
FIG. 13 is an end cross-sectional view of the light tube of the LED tube light of another embodiment of present invention as taken along axial direction thereof.

Furthermore, as shown in FIG. 12, the inner circumferential surface of the light tube 1 is also provided or bonded with a reflective film layer 12, the reflective film layer 12 is provided around the LED light sources 202, and occupy a portion of an area of the inner circumferential surface of the light tube 1 arranged along the circumferential direction thereof. As shown in FIG. 12, the reflective film layer 12 is disposed at two sides of the LED light sources 202 extending along a circumferential direction of the light tube. The reflective film layer 12 when viewed by a person looking at the light tube from the side (in the X-direction shown in FIG. 12) serve to block the LED light sources 202, so that the person does not directly see the LED light sources 202, thereby reducing the visual graininess effect. On the other hand, reflection light passes through the reflective film 12 emitted from the LED light source 202, can control the divergence angle of the LED tube light, so that more light is emitted in the direction that has been coated with the reflective film, such that the LED tube light has higher energy efficiency when providing same level of illumination performance. Specifically, the reflection film layer 12 provided on the inner peripheral surface of the light tube 1, and has a plurality of openings 12a on the reflective film layer 12 which are configured corresponding to the locations of the LED light sources 202, the sizes of the openings 12a are the same or slightly larger than the size of the LED light source 202. During assembly, the LED light sources 202 are mounted on the LED light bar 2 (or flexible substrate) provided on the inner surface of the light tube 1, and then the reflective film layer 12 is adhered to the inner surface of the light tube, so that the openings 12a of the reflective film layer 12 are matched to the corresponding LED light sources 202 in a one-to-one relationship, and the LED light sources 202 are exposed to the outside of the reflective film layer 12. In the present embodiment, the reflectance of the reflective film layer 12 is at least greater than 85%. Better reflectance of 90% can also be achieved. Meanwhile, more preferably reflectance at more than 95% reflectance can also be achievable, in order to obtain more reflectance. In one embodiment, the reflective film layer 12 extends circumferentially along the length of the light tube 1 occupying about 30% to 50% of the inner surface area of the light tube 1. In other words, extending along a circumferential direction of the light tube 1, a circumferential length of the reflective film layer 12 along the inner circumferential surface of the light tube 1 and a circumferential length of the light tube 1 has a ratio of 0.3 to 0.5. In the illustrated embodiment of FIG. 12, the reflective film layer 12 is disposed substantially in the middle along a circumferential direction of the light tube 1, so that the two distinct portions or sections of the reflective film layer 12 disposed on the two sides of the LED light bar 2 are substantially equal in area. The reflective film layer 12 material may be made of PET or selectively adding some reflective materials such as strontium phosphate or barium sulfate, with a thickness between 140 μm to 350 μm, or between 150 μm to 220 μm for a more preferred embodiment. In other embodiments, the reflective film layer 12 may be provided in other forms, for example, along the circumferential direction of the light tube 1 on one or both sides of the LED light source 202, while occupying the same 30% to 50% of the inner surface area of the light tube 1. Alternatively, as shown in FIG. 13, the reflective film layer 12 can be without any openings, so that the reflective film layer 12 is directly adhered or mounted to the inner surface of the light tube 1 such as shown in the illustrated embodiment, and followed by mounting or fixing the LED light bar 2, with the LED light sources 202 already being mounted thereon, on the reflective film layer 12. In another embodiment, just the reflection film layer 12 may be provided without a diffusion film layer 13 being present, as shown in FIG. 14.

Figure 22:
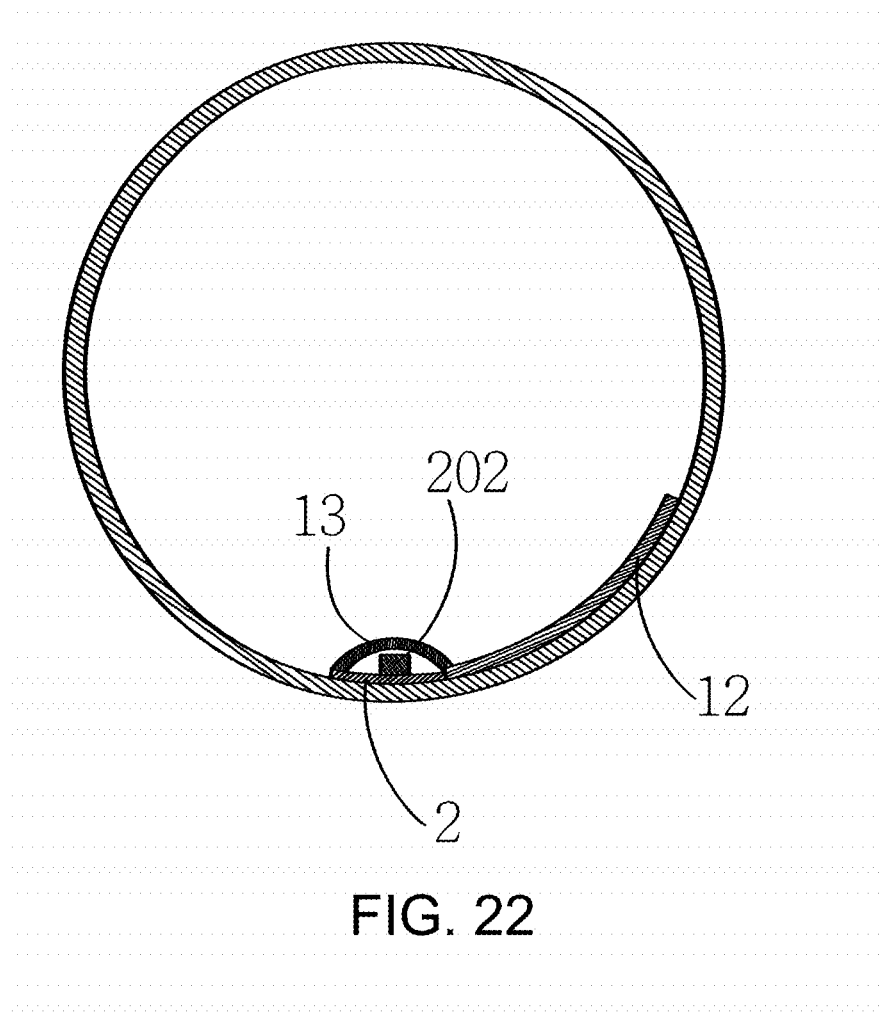
FIG. 22 is an end cross-sectional view of the light tube of the LED tube light of another embodiment of present invention having a reflective film layer disposed on one side of the LED light bar as taken along axial direction of the light tube.
Figure 23:
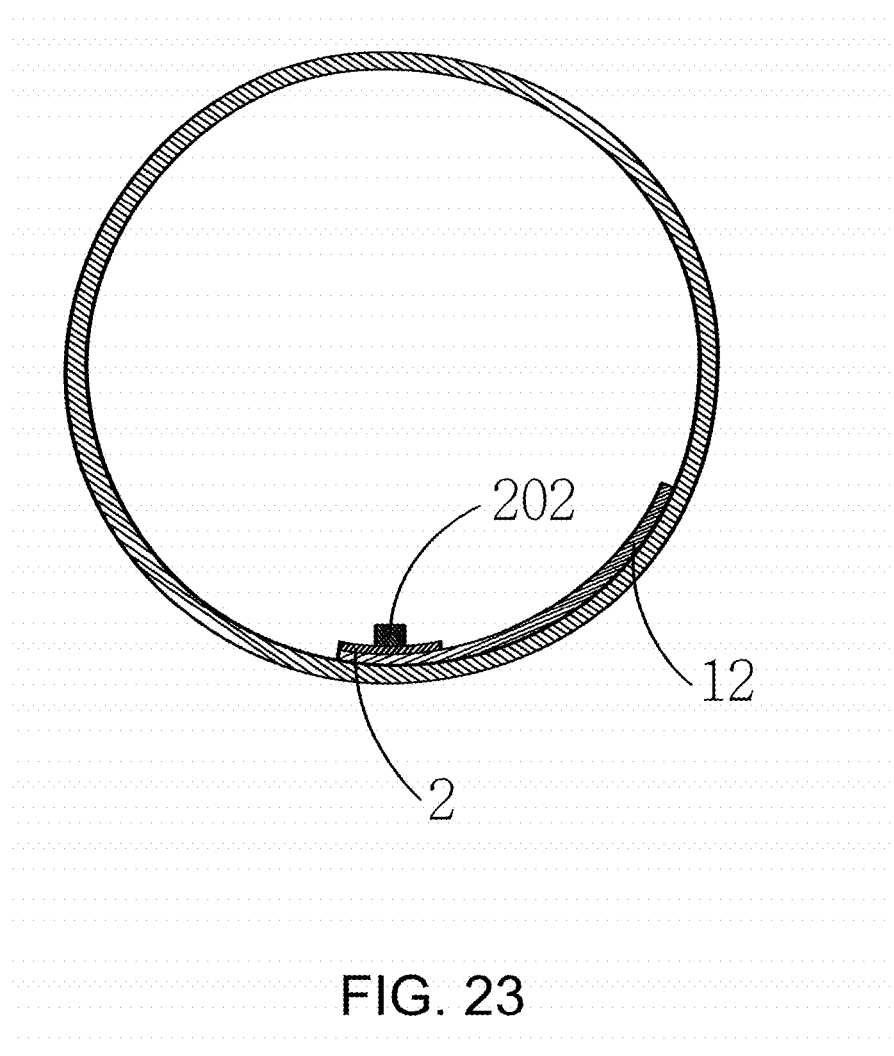
FIG. 23 is an end cross-sectional view of the light tube of the LED tube light of yet another embodiment of present invention having a reflective film layer disposed under the LED light bar as taken along axial direction of the light tube.

In another embodiment, the reflective film layer 12 and the LED light bar 2 are contacted on one side thereof as shown in FIG. 22. In addition, a diffusion film layer 13 is disposed above the LED light bar 2. Referring to FIG. 23, the LED light bar 2 (with the LED light sources 202 mounted thereon) is directly disposed on the reflective film layer 12, and the LED light bar 2 is disposed at an end region of the reflective layer 12 (without having any diffusion layer) of the LED tube light of yet another embodiment of present invention.

In other embodiments, the width of the LED light bar 2 (along the circumferential direction of the light tube) can be widened to occupy a circumference area of the inner circumferential surface of the light tube 1 at a ratio between 0.3 to 0.5, in which the widened portion of the LED light bar 2 can provide reflective effect similar to the reflective film. As described in the above embodiment, the LED light bar 2 may be coated with a circuit protection layer, the circuit protection layer may be an ink material, providing an increased reflective function, with a widened flexible substrate using the LED light sources as starting point to be circumferentially extending, so that the light is more concentrated. In one embodiment, the circuit protection layer is coated on just the top side of the LED light bar 2 (for example, being disposed on an outermost layer of the LED light bar 2 (or bendable circuit board).

Figure 14:
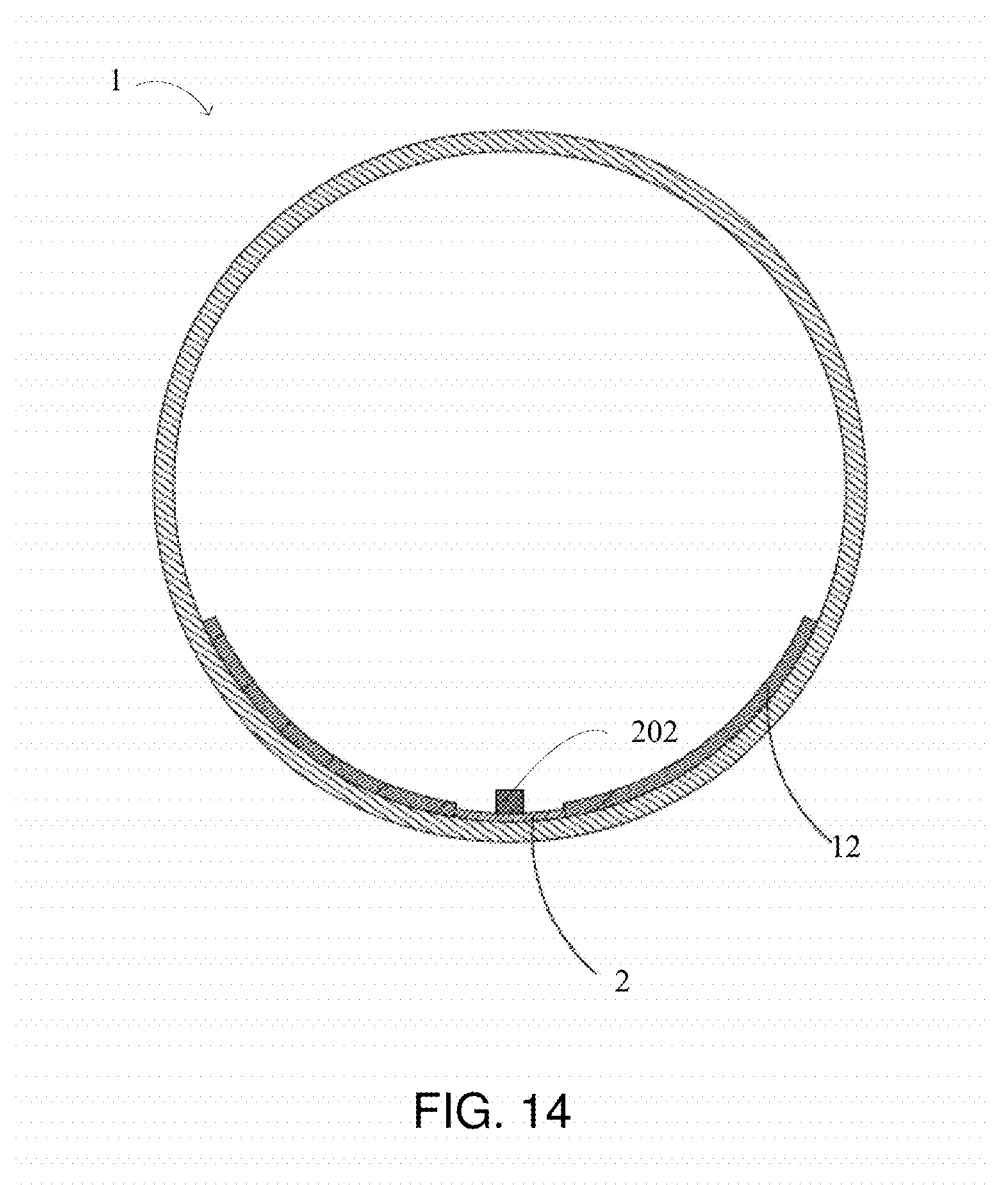
FIG. 14 is an end cross-sectional view of the light tube of the LED tube light of yet another embodiment of present invention as taken along axial direction thereof.

In the embodiment shown in FIGS. 12-14, the inner circumferential surface of the glass light tube, can be coated entirely or partially with an optical diffusion coating (parts that have the reflective film being coated would not be coated by the optical diffusion coating). The optical diffusion coating is preferably applied to the outer surface at the end region of the light tube 1, so that the end cap 3 and the light tube 1 can be bonded more firmly.

Referring to FIG. 15, the LED light source 202 may be further modified to include a LED lead frame 202b having a recess 202a, and an LED chip 18 disposed in the recess 202a. The recess 202a is filled with phosphor, the phosphor coating is covered on the LED chip 18 to convert to the desired color light. In one light tube 1, there are multiple number of LED light sources 202, which are arranged into one or more rows, each row of the LED light sources 202 is arranged along the axis direction or length direction (Y-direction) of the light tube 1. The recess 202a belonging to each LED lead frame 202b may be one or more. In the illustrated embodiment, each LED lead frame 202b has one recess 202a, and correspondingly, the LED lead frame 202b includes two first sidewalls 15 arranged along a length direction (Y-direction) of the light tube 1, and two second sidewalls 16 arranged along a width direction (X-direction) of the light tube 1. In the present embodiment, the first sidewall 15 is extending along the width direction (X-direction) of the light tube 1, the second sidewall 16 is extending along the length direction (Y-direction) of the light tube 1. The first sidewall 15 is lower in height than the second sidewall 16. The recess 202a is enclosed by the first sidewalls 15 and the second sidewalls 16. In other embodiments, in one row of the LED light sources, it is permissible to have one or more sidewalls of the LED lead frames of the LED light sources to adopt other configuration or manner of extension structures. When the user is viewing the along the X-direction toward the light tube, the second sidewall 16 can block the line of sight of the user to the LED light source 202, thus reducing unappealing grainy spots. The first sidewall 15 can be extended along the width direction of the light tube 1, but as long as being extended along substantially similar to the width direction to be considered sufficient enough, and without requiring to be exactly parallel to the width direction of the light tube 1, and may be in a different structure such as zigzag, curved, wavy, and the like. The second sidewall 16 can be extended along the length direction of the light tube 1 but as long as being extended along substantially similar to the length direction to be considered sufficient enough, and without requiring to be exactly parallel to the length direction of the light tube 1, and may be in a different structure such as zigzag, curved, wavy, and the like. Having the first sidewall 15 being of a lower height than the second sidewall 16 is beneficial for allowing light illumination to be easily dispersed beyond the LED lead frame 202b, and no grainy effect is produced upon viewing in the Y-direction. The first sidewall 15 includes an inner surface 15a. The inner surface 15a of the first sidewall 15 is a sloped surface, which promotes better light guiding effect for illumination and facing toward outside of the recess. The inner surface 15a can be a flat or curved surface. The slope of the inner surface 15a is between about 30 degrees to 60 degrees. For example, the included angle between the bottom surface of the recess 202a and the inner surface 15a is between 120 and 150 degrees. In other embodiments, the slope of the inner surface of the first sidewall can also be between about 15 degrees to 75 degrees, for example, the included angle between the bottom surface of the recess 202a and the inner surface of the first sidewall is between 105 degrees to 165 degrees. Alternatively, the slope may be a combination of flat and curved surface. In other embodiments, if there are several rows of the LED light sources 202, arranged in a length direction (Y-direction) of the light tube 1, as long as the LED lead frames 202b of the LED light sources 202 disposed in the outermost two rows (at closest to the light tube) along in the width direction of the light tube 1, are to have two first sidewalls 15 configured along the length direction (Y-direction) and two second sidewalls 16 configured in one straight line along the width direction (X-direction), so that the second sidewalls 16 are disposed on a same side of the same row are collinear to one another. However, the arrangement direction of the LED lead frames 202b of the other LED light sources 202 that are located between the aforementioned LED light sources 202 disposed in the outermost two rows are not limited, for example, for the LED lead frames 202b of the LED light sources 202 located in the middle row (third row), each LED lead frame 202b can include two first sidewalls 15 arranged along in the length direction (Y-direction) of the light tube 1, and two second sidewalls 16 arranged along in the width direction (X-direction) of the light tube 1, or alternatively, each LED lead frame 202b can include two first sidewalls 15 arranged along in the width direction (X-direction) of the light tube 1, and two second sidewalls 16 arranged along in the length direction (Y-direction) of the light tube 1, or arranged in a staggered manner. When the user is viewing from vantage point from the side of the light tube along the X-direction, the outermost two rows of the LED lead frames 202b of the LED light sources 202 can block the user's line of sight for directly seeing the LED light sources 202. As a result, the visual graininess unpleasing effect is reduced. Similar to the present embodiment, with regard to the two outermost rows of the LED light sources, one or more of the sidewalls of the LED lead frames of the LED light sources to adopt other configurational or distribution arrangement. When multiple number of the LED light sources 202 are distributed or arranged along the length direction of the light tube in one row, the LED lead frames 202b of the multiple number of the LED light sources 202 have all of the second sidewalls 16 thereof disposed in one straight line along the width direction of the light tube, respectively, for example, being at the same side, the second sidewalls 16 form substantially a wall structure to block the user's line or sight from seeing directly at the LED light source 202. When the multiple number of the LED light sources 202 are distributed or arranged along the length direction of the light tube in multiple rows, the multiple number of the LED light sources 202 are distributed or arranged along the width direction, with regard to the two outermost rows of the LED light sources located along the width direction of the light tube, each row of the LED lead frames 202b of the multiple number of the LED light sources 202, in which all of the second sidewalls 16 disposed at the same side are in one straight line along the width direction of the light tube, for example, being at the same side, as long as the second sidewalls 16 of the LED light sources 202 located at the outermost two rows can block the user's line of sight for directly seeing the LED light sources 202, the reduction of visual graininess unpleasing effect can thereby be achieved. Regarding the one or more middle row(s) of the LED light sources 202, the arrangement, configuration or distribution of the sidewalls are not specifically limited to any particular one, and can be same as or different from the arrangement and distribution of the two outermost rows of the LED light sources, without departing from the spirit and scope of present disclosure.

In one embodiment, the LED light bar includes a dielectric layer and one conductive layer, in which the dielectric layer and the conductive layer are arranged in a stacking manner.

The narrowly curved end regions of the glass tube can reside at two ends, or can be configured at just one end thereof in different embodiments. In alternative embodiment, the LED tube light further includes a diffusion layer (not shown) and a reflective film layer 12, in which the diffusion layer is disposed above the LED light sources 202, the light emitting from the LED light sources 202 is passed through the diffusion layer and the light tube 1. Furthermore, the diffusion film layer can be an optical diffusion covering above the LED light sources without directly contacting thereof. In addition, the LED light sources 202 can be bondedly attached to the inner circumferential surface of the light tube. In other embodiments, the magnetic member 9 can be a magnetic object that is magnetic without being made of metal. The magnetic object can be doped into the hot melt adhesive.

While various aspects of the invention have been described in terms of various example embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

We claim:

1. An LED tube lamp, comprising:
    a lamp tube;
    an LED light bar disposed inside the lamp tube with a plurality of LED light sources provided on the LED light bar;
    a diffusion film layer disposed inside the lamp tube and configured to transmit the light emitted from the LED light sources; and
    a reflective film layer disposed on an inner circumferential surface of the lamp tube;
    wherein the reflective film layer is conformally formed on the inner circumferential surface of the lamp tube and is configured to partially occupy the inner circumferential surface of the lamp tube along a longitudinal direction and a circumferential direction of the lamp tube, and the diffusion film layer is a sheet disposed to cover the LED light sources without making direct contact with the LED light sources, and
    wherein a portion of the conformally formed reflective film layer extends above at least part of the diffusion film layer.

2. The LED tube lamp according to claim 1,
    wherein the reflective film layer further comprises an opening; and
    the LED light bar is disposed in the opening.

3. The LED tube lamp of claim 2, wherein the opening is shaped to properly accommodate the LED light bar.

4. The LED tube lamp of claim 1, wherein the reflective film layer further comprises an opening; and
    an LED light source is disposed in the opening.

5. The LED tube lamp of claim 4, wherein the opening is shaped to properly accommodate the LED light source.

6. The LED tube lamp of claim 4, wherein the size of the opening is the same or slightly larger than the size of the LED light source.

7. The LED tube lamp of claim 4, wherein the LED light bar is adjacent to one side of the reflective film layer along the circumferential direction of the lamp tube.

8. The LED tube lamp of claim 4, wherein two portions of the reflective film layer beside the two opposite sides of the LED light bar along the circumferential direction of the lamp tube have substantially the same area.

9. The LED tube lamp of claim 1, wherein the reflective film layer is configured to extend from one side of the LED light bar and along the circumferential direction of the lamp tube.

10. The LED tube lamp of claim 1, wherein the reflective film layer is configured to extend from two sides of the LED light bar and along the circumferential direction of the lamp tube.

11. The LED tube lamp of claim 1,
    wherein the LED light bar is disposed on the reflective film layer.

12. The LED tube lamp of claim 1, wherein a ratio of a length of the reflective film layer that extends along the inner circumferential surface of the lamp tube to a circumferential length of the inner circumferential surface of the lamp tube is 0.3 to 0.5.

13. The LED tube lamp of claim 12, wherein the LED light bar is disposed along the longitudinal direction of the lamp tube.

14. The LED tube lamp of claim 1, wherein the reflective film layer has a reflectance of 85% or more.

15. The LED tube lamp of claim 1, wherein the average thickness of the reflective film layer has a value in the range from 140 µm to 350 µm.

16. The LED tube lamp of claim 1, wherein the LED light bar is bendable.

17. The LED tube lamp of claim 1, wherein the reflective film layer further comprises at least one of strontium phosphate and barium sulfate.

18. The LED tube lamp of claim 17, wherein the reflective film layer comprises strontium phosphate.

\* \* \* \* \*